(12) United States Patent
Inuzuka

(10) Patent No.: US 12,082,387 B2
(45) Date of Patent: Sep. 3, 2024

(54) SEMICONDUCTOR DEVICE

(71) Applicant: KIOXIA CORPORATION, Tokyo (JP)

(72) Inventor: Yuki Inuzuka, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 182 days.

(21) Appl. No.: 17/899,962

(22) Filed: Aug. 31, 2022

(65) Prior Publication Data
US 2023/0301093 A1    Sep. 21, 2023

(30) Foreign Application Priority Data

Mar. 18, 2022    (JP) .................................. 2022-043864

(51) Int. Cl.
   G11C 16/10    (2006.01)
   G11C 16/04    (2006.01)
   H10B 43/27    (2023.01)

(52) U.S. Cl.
   CPC ......... *H10B 43/27* (2023.02); *G11C 16/0483* (2013.01); *G11C 16/10* (2013.01)

(58) Field of Classification Search
   CPC ...... H10B 43/27; G11C 16/0483; G11C 16/10
   USPC ........................................ 365/185.11, 185.24
   See application file for complete search history.

(56) References Cited

U.S. PATENT DOCUMENTS

| | | | |
|---|---|---|---|
| 9,496,038 B1* | 11/2016 | Kwak | G11C 16/26 |
| 11,482,270 B1* | 10/2022 | Dokania | G11C 11/40615 |
| 2009/0273978 A1* | 11/2009 | Fukuda | G11C 16/3404 |
| | | | 365/185.24 |
| 2014/0183617 A1* | 7/2014 | Yaegashi | H01L 27/105 |
| | | | 257/320 |
| 2017/0294483 A1* | 10/2017 | Terai | H10N 70/8828 |
| 2018/0102371 A1* | 4/2018 | Shiimoto | H10B 20/20 |
| 2018/0350829 A1* | 12/2018 | Tezuka | G11C 11/5671 |
| 2019/0189221 A1* | 6/2019 | Kim | G11C 16/08 |
| 2020/0152242 A1* | 5/2020 | Chang | G11C 5/14 |
| 2020/0264805 A1 | 8/2020 | Yoshii et al. | |
| 2021/0035635 A1* | 2/2021 | Yoon | G11C 13/0069 |
| 2021/0043260 A1* | 2/2021 | Tsuda | G11C 16/16 |

(Continued)

FOREIGN PATENT DOCUMENTS

| | | |
|---|---|---|
| JP | 2020-135904 A | 8/2020 |
| JP | 2021-174567 A | 11/2021 |

*Primary Examiner* — Michael T Tran
(74) *Attorney, Agent, or Firm* — Kim & Stewart LLP

(57) ABSTRACT

A semiconductor device includes a plurality of conductive layers stacked above one another in a first direction and including a first conductive layer, second conductive layers, and third conductive layers, a semiconductor film extending in the first direction through the conductive layers, an insulating film around the semiconductor film between the semiconductor film and the plurality of conductive layers. During a program operation performed on a first memory cell, a program voltage is applied to the first conductive layer while a first voltage is applied to the second conductive layers and a second voltage different from the first voltage is applied to the third conductive layers. The second conductive layers are each connected to gates of second memory cells programmed to store m bits, and the third conductive layers are each connected to gates of third memory cells programmed to store n bits, where n is different from m.

20 Claims, 13 Drawing Sheets

(56) References Cited

U.S. PATENT DOCUMENTS

| | | | |
|---|---|---|---|
| 2021/0082959 A1* | 3/2021 | Domae | H10B 51/20 |
| 2021/0202514 A1* | 7/2021 | Han | H10B 63/845 |
| 2021/0335418 A1 | 10/2021 | Yanagidaira et al. | |
| 2021/0408047 A1* | 12/2021 | Wang | H01L 29/41775 |
| 2022/0005830 A1* | 1/2022 | Wu | H01L 29/6684 |
| 2022/0301632 A1* | 9/2022 | Maeda | G11C 29/42 |
| 2022/0406398 A1* | 12/2022 | Yang | G11C 16/102 |

\* cited by examiner

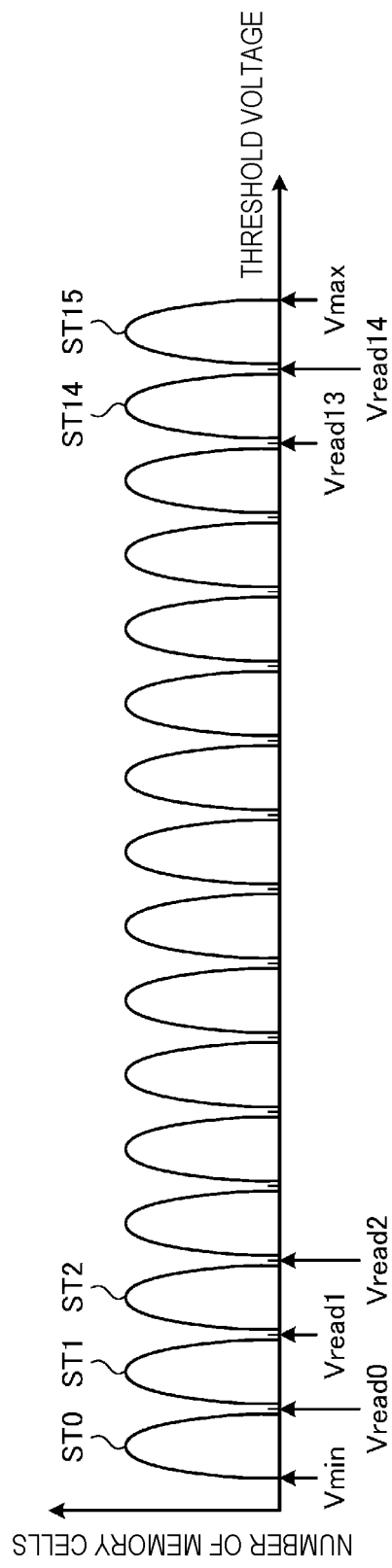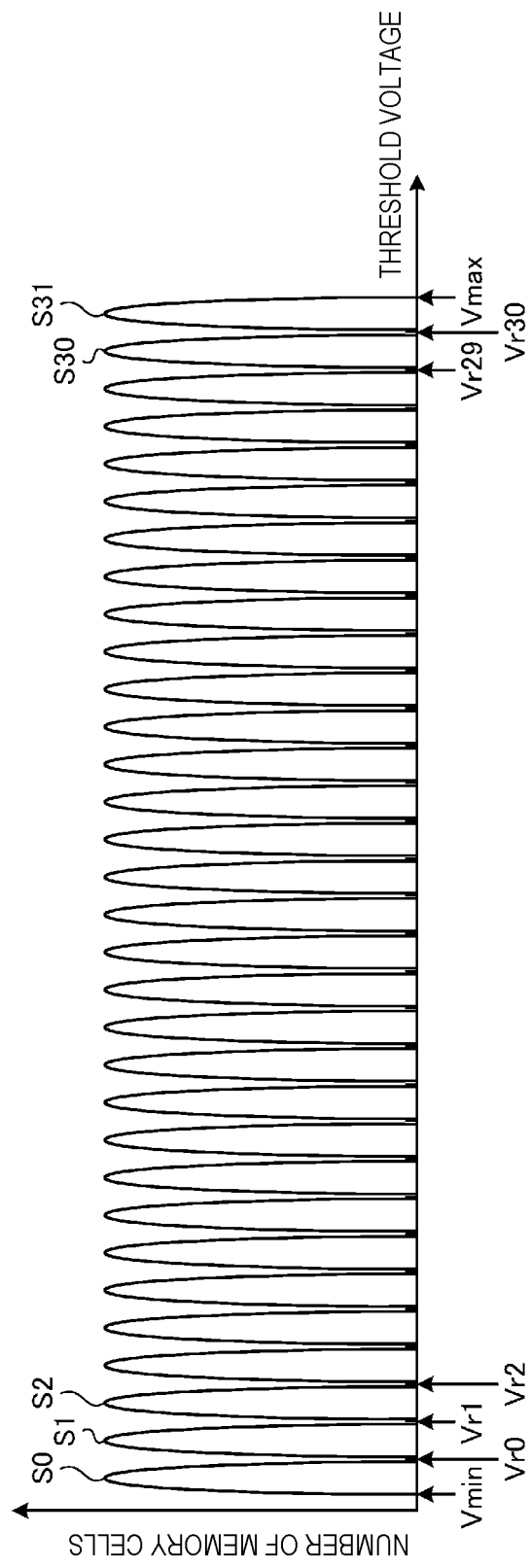

SEMICONDUCTOR DEVICE

CROSS-REFERENCE TO RELATED APPLICATION(S)

This application is based upon and claims the benefit of priority from Japanese Patent Application No. 2022-043864 filed Mar. 18, 2022, the entire contents of which are incorporated herein by reference.

FIELD

Embodiments described herein relate generally to a semiconductor device.

BACKGROUND

A semiconductor device having a three-dimensional structure is known in which a semiconductor film extends in a stacking direction in a stack in which a plurality of conductive layers is stacked via an insulating layer, and a portion close to each conductive layer and the semiconductor film functions as a memory cell. In such a semiconductor device, it is desirable to improve the operation reliability.

DESCRIPTION OF THE DRAWINGS

FIGS. 4A and 4B are views illustrating threshold voltage distributions of memory cells according to the embodiment.

DETAILED DESCRIPTION

Embodiments provide a semiconductor device capable of improving operation reliability.

In general, according to one embodiment, a semiconductor device includes a plurality of conductive layers stacked above one another in a first direction and including a first conductive layer, second conductive layers, and third conductive layers, a first semiconductor film extending in the first direction through the plurality of conductive layers, a first insulating film around the first semiconductor film between the first semiconductor film and the plurality of conductive layers. During a program operation performed on a first memory cell disposed at a first position where the first conductive layer intersects the first semiconductor film, a program voltage is applied to the first conductive layer while a first voltage is applied to the second conductive layers and a second voltage different from the first voltage is applied to the third conductive layers. The second conductive layers are each connected to gates of second memory cells, each of which has been programmed to store m bits of data, and the third conductive layers are each connected to gates of third memory cells, each of which has been programmed to store n bits of data, where n is different from m.

A semiconductor device according to an embodiment will be described in detail with reference to the accompanying drawings. The present disclosure is not limited to the embodiment.

Embodiment

A semiconductor device according to an embodiment has a three-dimensional structure in which a semiconductor film extends in a stacking direction in a stack in which a plurality of conductive layers is stacked via an insulating layer, and a portion close to each conductive layer and the semiconductor film functions as a memory cell. An effort is made to improve the operation reliability in the three-dimensional structure.

Figure 1:
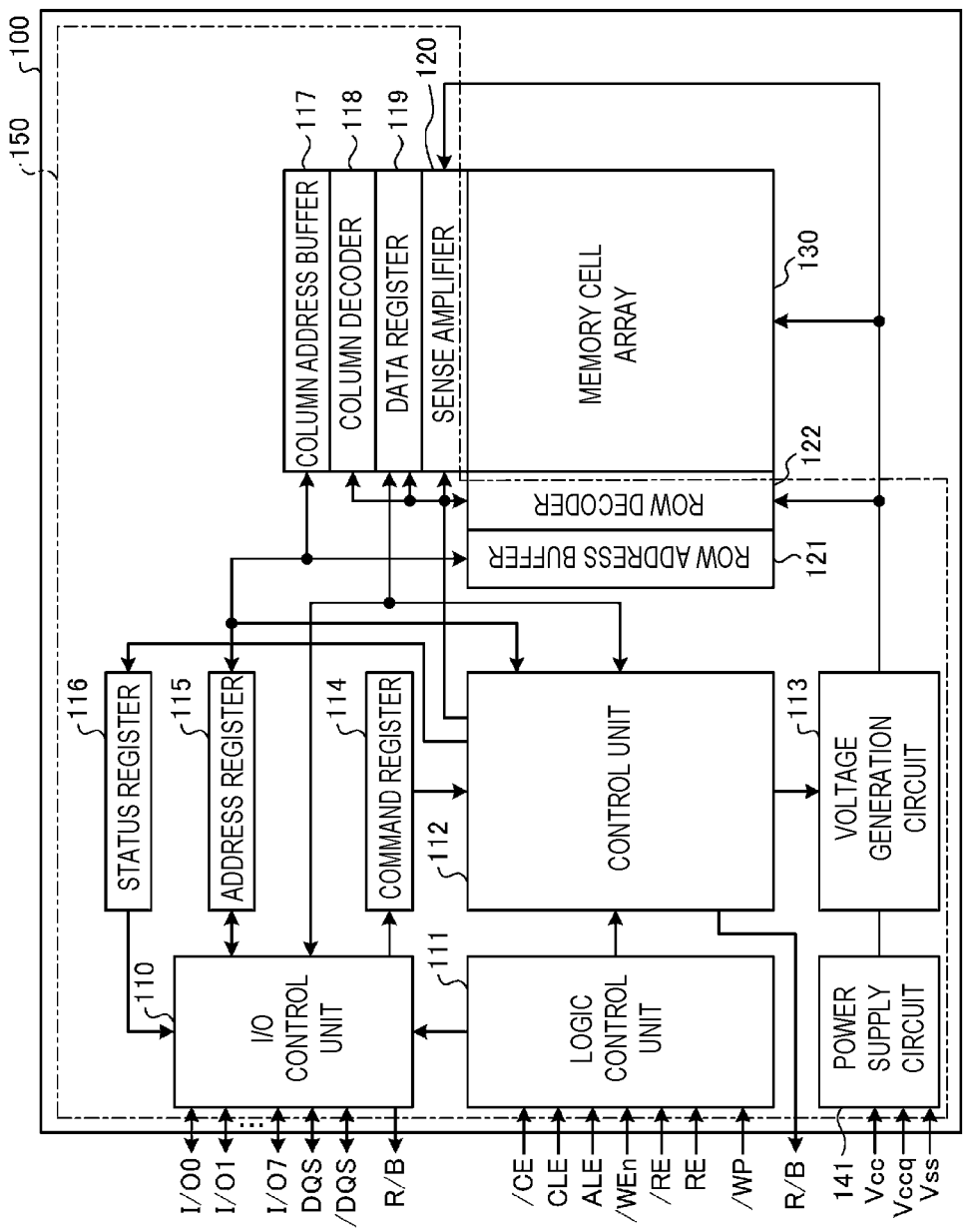
FIG. 1 is a view illustrating the configuration of a semiconductor device according to an embodiment.

The semiconductor device 100 is a non-volatile memory such as a NAND type flash memory, and may be configured as illustrated in FIG. 1. The semiconductor device 100 includes a memory cell array 130 and a peripheral circuit 150.

The peripheral circuit 150 includes the following components, each of which is a circuit: an I/O control unit 110, a logic control unit 111, a control unit 112, a voltage generation circuit 113, a command register 114, an address register 115, a status register 116, a column address buffer 117, a column decoder 118, a data register 119, a sense amplifier 120, a row address buffer 121, a row decoder 122, a power supply circuit 141, and a clock generation circuit 142.

The logic control unit 111 receives inputs of various control signals via input pins (/CE, ALE, etc.) of various control signals. The I/O control unit 110 executes transfer of data to a register serving as a storage destination of the I/O signal based on the control signals received by the logic control unit 111. Further, the logic control unit 111 transfers the received control signals to the control unit 112. The /CE illustrated as the input pin of the logic control unit 111 indicates a chip enable pin of the semiconductor device 100.

The control unit 112 includes a state transition circuit (e.g., state machine) that makes a state transition based on various control signals received via the logic control unit 111, and controls the entire operation of the semiconductor device 100.

The I/O control unit 110 is a buffer circuit that transmits and receives I/O signals and strobe signals to and from a controller via I/O signal pins I/O0 to I/O7 and strobe pins DQS and /DQS. The commands, addresses, and data (write data) input by the I/O control unit 110 as I/O signals via the I/O signal pins I/O0 to I/O7 are transferred to and stored in the address register 115, the command register 114, and the data register 119, respectively.

The power supply circuit 141 receives, for example, power supply voltages Vcc, Vccq and Vss from the controller via a power supply pin, and supplies the voltages to each part of the semiconductor device 100. The power supply voltage Vccq is, for example, a power supply voltage used for the operation of the I/O control unit 110. The power supply voltage Vss is, for example, a ground voltage.

The control unit 112 instructs the voltage generation circuit 113 of the voltage value to be generated and the power supply timing. The control unit 112 includes a clock generation circuit (not shown). The clock generation circuit supplies a clock signal CLK to, for example, a charge pump circuit (not shown) in the voltage generation circuit 113. In addition, the control unit 112 transmits a ready busy signal R/B to the controller.

The voltage generation circuit 113 generates a predetermined voltage according to the control of the control unit 112. The voltage generation circuit 113 supplies the generated voltage to the memory cell array 130, the row decoder 122, and the sense amplifier 120.

The status register 116 stores status information indicating whether the writing to the memory cell array 130 is successful and status information indicating whether the erasing to the memory cell array 130 is successful. The status information is transmitted to the controller as a response signal by the I/O control unit 110.

The memory cell array 130 includes a plurality of memory cells and stores write data from a host (not illustrated).

The row decoder 122, the column decoder 118, and the sense amplifier 120 execute access to the memory cell array 130 based on the control by the control unit 112. The row decoder 122 selects a word line corresponding to the row address. The column decoder 118 selects a bit line corresponding to the column address. The bit line may be electrically connected to a memory string MS (to be described later). The sense amplifier 120 applies a voltage to the bit line selected by the column decoder 118, and writes the data stored in the data register 119 to the memory cell transistor located at the intersection of the word line selected by the row decoder 122 and a memory string of the bit line selected by the column decoder 118. Further, the sense amplifier 120 reads out the data stored in the memory cell transistor located at the intersection of the word line selected by the row decoder 122 and a memory string of the bit line selected by the column decoder 118 via the bit line, and stores the read data in the data register 119. The data stored in the data register 119 is sent to the I/O control unit 110 through the data line, and is transferred from the I/O control unit 110 to the outside (e.g., a controller).

Figure 2:
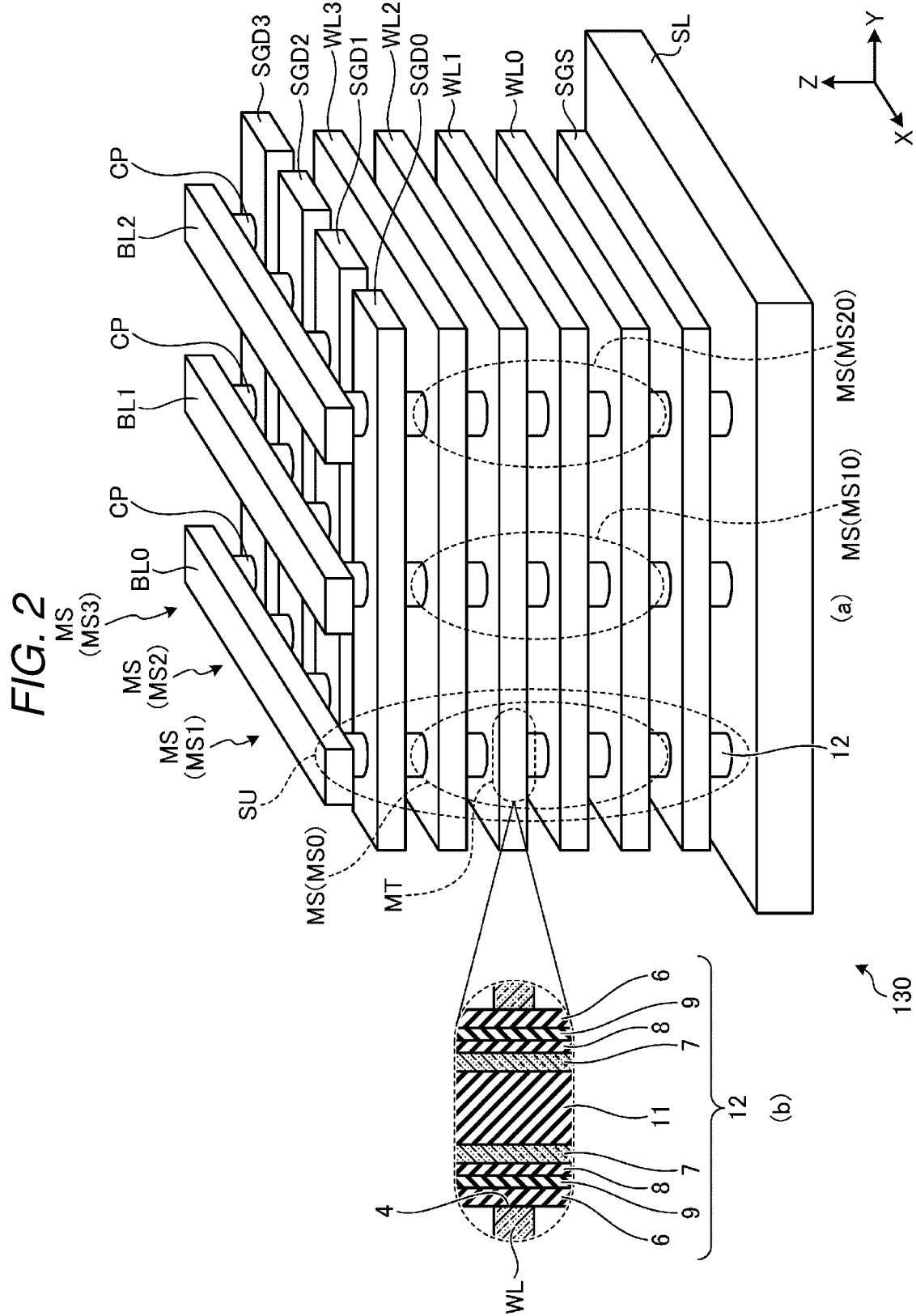
FIG. 2 is a perspective view illustrating the configuration of a memory cell array according to the embodiment.

The memory cell array 130 may be configured as illustrated in FIG. 2. FIG. 2 is a perspective view illustrating the configuration of the memory cell array 130. In FIG. 2, the insulating layer and the interlayer insulating film are not illustrated for the sake of simplicity.

A source line SL extends in a plate shape above a substrate (not illustrated). In the following description, a direction perpendicular to the surface of the source line SL is defined as the Z direction, and two directions orthogonal to each other in the plane perpendicular to the Z direction are defined as the X direction and the Y direction.

A source side select gate line SGS is formed on the +Z side of the source line SL. A plurality of layers of word lines WL is stacked in the Z direction on the +Z side of the source side select gate line SGS. FIG. 2 illustrates an example in which four layers of word lines WL0 to WL3 are stacked. Drain side select gate lines SGD0 to SGD3 are formed on the +Z side of the word line WL3.

The source side select gate line SGS extends in the XY direction on the +Z side of the source line SL. The word lines WL0 to WL3 extend in the XY direction on the +Z side of the source side select gate line SGS. The drain side select gate lines SGD0 to SGD3 extend in the Y direction on the +Z side of the word lines WL0 to WL3.

A columnar body 12 extends in the Z direction to penetrate the drain side select gate lines SGD0 to SGD3, the word lines WL0 to WL3, and the source side select gate line SGS. A string unit SU includes one of the drain side select gate lines SGD0 to SGD3. That is, one string unit SU includes a plurality of memory strings MS arranged along the Y direction and may be selectively accessed by a corresponding one of the drain side select gate lines SGD0 to SGD3.

Bit lines BL0 to BL2 extend in the X direction on the +Z side of the drain side select gate lines SGD0 to SGD3. The extending direction of the bit lines BL0 to BL2 is depicted as the X direction, which is orthogonal to the extending direction of the drain side select gate lines SGD0 to SGD3, which is depicted as the Y direction. The X and Y directions are orthogonal to the stacking direction of the word lines WL0 to WL3, which is depicted as the Z direction. The columnar body 12 extends in the Z direction, for example, from the source line SL to the bit lines BL0 to BL2.

A columnar insulator 11 is formed at the center of the columnar body 12. For example, a silicon oxide film may be used as the material of the columnar insulator 11. A channel semiconductor film 7 is formed between the outer surface of the columnar insulator 11 and the inner surface of a through via hole 4; a tunnel insulating film 8 is formed between the inner surface of the through via hole 4 and the channel semiconductor film 7; a charge storage film 9 is formed between the inner surface of the through via hole 4 and the tunnel insulating film 8; and a block insulating film 6 is formed between the inner surface of the through via hole 4 and the charge storage film 9. Each of the channel semiconductor film 7, the tunnel insulating film 8, the charge storage film 9, and the block insulating film 6 penetrates the source side select gate line SGS, the word lines WL0 to WL3, and the drain side select gate lines SGD0 to SGD3, respectively. As for the channel semiconductor film 7, for example, a semiconductor such as Si may be used. As for the tunnel insulating film 8 and the block insulating film 6, for example, a silicon oxide film may be used. As for the charge storage film 9, for example, a silicon nitride film or an ONO film (a three-layer structure of silicon oxide film/silicon nitride film/silicon oxide film) may be used.

In FIG. 2, the configuration in which the memory cells MT are stacked in four layers has been illustrated, but the memory cells MT may be stacked in n (n is an integer of 2 or more) layers.

Further, in the example of FIG. 2, descriptions have been made on a method of forming the columnar insulator 11 at the center of the columnar body 12 that penetrate the source side select gate line SGS, the word lines WL0 to WL3, and the drain side select gate lines SGD0 to SGD3. However, a columnar semiconductor may be used instead of the columnar insulator 11.

Figure 3:
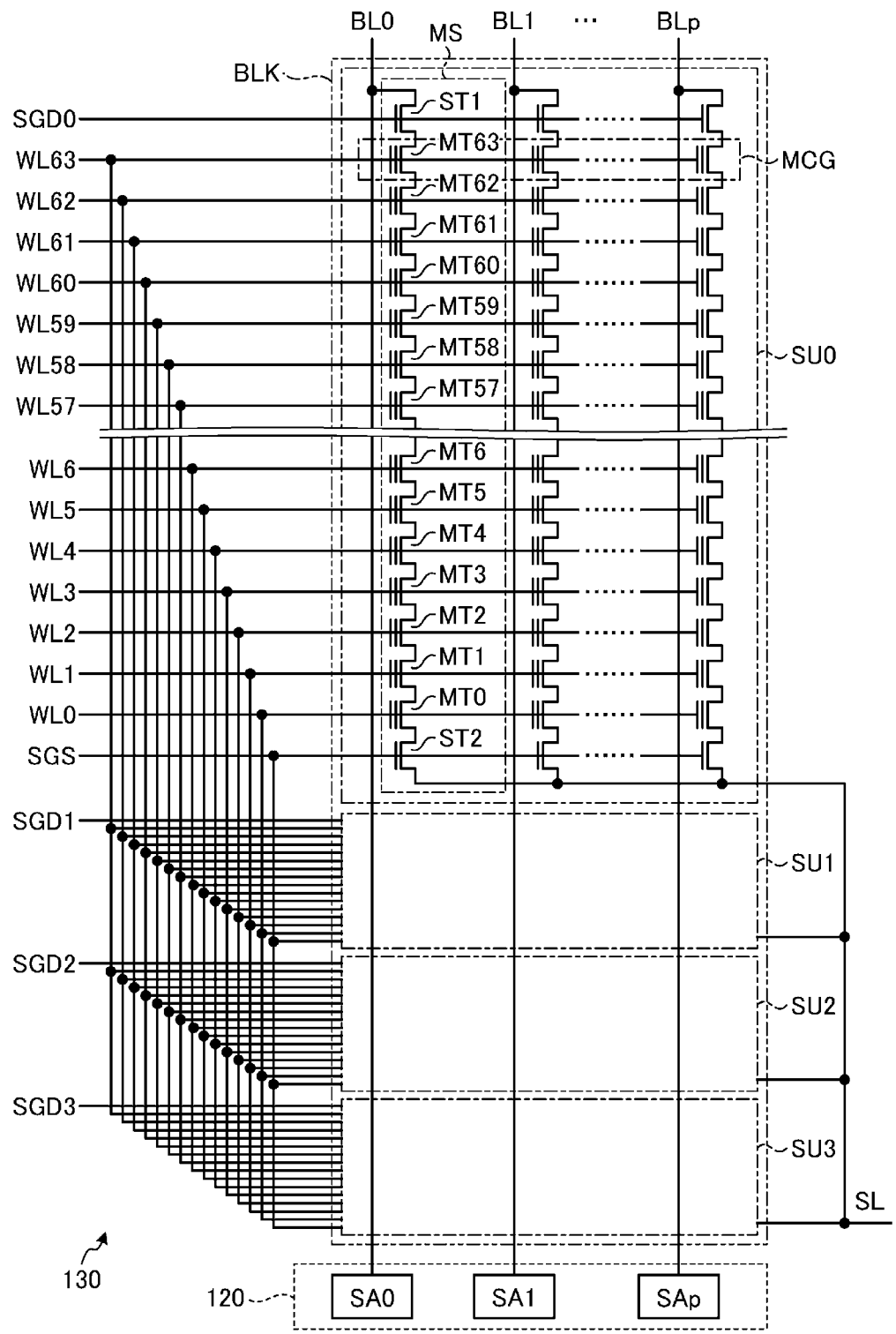
FIG. 3 is a circuit diagram illustrating the configuration of a block according to the embodiment.

The memory cell array 130 includes a plurality of blocks. Each block includes a plurality of memory cell transistors MT at positions where a plurality of word lines and memory strings of a plurality of bit lines intersect. Hereinafter, the memory cell transistor MT will be simply referred to as a memory cell MT. FIG. 3 is a circuit diagram illustrating a configuration example of one block.

The block BLK includes a plurality of string units SU0 to SU3. The plurality of string units SU0 to SU3 correspond to the drain side select gate lines SGD0 to SGD3 and share the source side select gate line SGS. The string units SU0 to SU3 may be selectively accessed by the drain side select gate lines SGD0 to SGD3, respectively. Further, each of the string units SU0 to SU3 includes a plurality of memory strings MS.

Each memory string MS includes, for example, 64 memory cells MT (MT0 to MT63) and select transistors ST1 and ST2. The memory cell MT includes a control gate and a charge storage film, and stores data in a non-volatile manner. The 64 memory cells MT (MT0 to MT63) are connected in series between the source of the select transistor SDT and the drain of the select transistor ST2. The number of memory cells MT in the memory string MS is not limited to 64 and may be 4 (as shown in FIG. 2) or any number.

Bit lines BL0 to BLp (indicated by BL when the respective bit lines are not distinguished from each other) are connected to the memory string MS. When the select transistor ST1 is turned on, a current path may be established between the channel region of each memory cell MT in the memory string MS and the bit line BL. A corresponding sense amplifier SA among a plurality of sense amplifiers SA0 to SAp in a sense amplifier circuit SAC is connected to each bit line BL.

The word lines WL0 to WL63 (indicated by WL when the respective word lines are not distinguished from each other) commonly connect the control gates of the memory cells MT between memory strings MS in each string unit SU in the physical block BLK. That is, the control gates of the memory cells MT in the same row in each string unit SU in the physical block BLK are connected to the same word line WL. That is, the string unit SU of the physical block BLK includes a plurality of memory cell groups MCG corresponding to a plurality of word lines WL, and each memory cell group MCG includes (p+1) memory cells MT connected to the same word line WL. When configured to store a 1-bit value in each memory cell MT (when operating in single-level cell (SLC) mode), (p+1) memory cells MT connected to the same word line WL (i.e., the memory group MCG) is treated as one page, and a data writing process and a data reading process are performed for each page.

Each memory cell MT may be configured to store a value of a plurality of bits. For example, when each memory cell MT may store n (n≥2)-bit value, the storage capacity per word line WL is equal to the size of n pages. That is, each memory cell group MCG is treated as n pages. For example, in the multi-level cell (MLC) mode in which each memory cell MT stores a 2-bit value, data for two pages is stored in each word line WL. Alternatively, in the triple-level cell (TLC) mode in which each memory cell MT stores a 3-bit value, data for three pages is stored in each word line WL. Alternatively, in the quad-level cell (QLC) mode in which each memory cell MT stores a 4-bit value, data for four pages is stored in each word line WL. Alternatively, in the penta-level cell (PLC) mode in which each memory cell MT stores a 5-bit value, data for five pages is stored in each word line WL.

In the QLC mode, as illustrated in FIG. 4A, the control range of threshold voltages (the range from Vmin to Vmax) is divided into 16 states (small areas) ST0 to ST15. Different 4-bit values are associated with each of the states ST0 to ST15.

In the example of FIG. 4A, the 16 states ST0 to ST15 correspond to 4-bit values of "1111", "1110", "1101", "1100", "1011", "1010", "1001", "1000", "0111", "0110", "0101", "0100", "0011", "0010", "0001", and "0000" from the side with the lowest voltage.

The four bits corresponding to each of the states ST, from the upper-order bit side to the lower-order bit side, represent the bit value included in the page PG0, the bit value included in the page PG1, the bit value included in the page PG2, and the bit value included in the page PG3, respectively.

During the program process, the threshold voltage of the memory cell MT to be programmed is controlled to belong to one of the 16 states ST0 to ST15 corresponding to the data to be programmed therein. The threshold voltage of the plurality of memory cells MT in the page or block after the program process may be represented as 16 distributions, each having the lobe shape illustrated in FIG. 4A, and separated by read voltages (Vread0 to Vread14), where the horizontal axis represents a range of threshold voltages, from low to high, and the vertical axis represents the number of memory cells that have the threshold voltages represented by the horizontal axis. A memory cell MT programmed in the QLC mode is also referred to as a quad-level cell (QLC).

The correspondence between the state and the data in the QLC mode is not limited to the example illustrated in FIG. 4A. Further, in FIG. 4A, for example, when the read voltage, Vread0, is set to 0 V, the control range of the threshold voltages (the range from Vmin to Vmax) is set from a negative region to a positive region. The setting of the control range of the threshold voltages is not limited thereto. For example, the control range of the threshold voltages may be set only in the positive region.

In the PLC mode, as illustrated in FIG. 4B, the control range of the threshold voltages (range from Vmin to Vmax) is divided into 32 states (small areas) S0 to S31. Different 5-bit values are associated with each of the states S0 to S31.

In the example of FIG. 4B, the 32 states S0 to S31 correspond to 5-bit values of "11111", "11110", "11101", "11100", "11011", "11010", "11001", "11000", "10111", "10110", "10101", "10100", "10011", "10010", "10001", "10000", "01111", "01110", "01101", "01100", "01011", "01010", "01001", "01000", "00111", "00110", "00101", "00100", "00011", "00010", "00001", and "00000" from the side with the lowest voltage.

The five bits corresponding to each of the states S0 to S31, from the upper-order bit side to the lower-order bit side, represent the bit value included in the page P0, the bit value included in the page P1, the bit value included in the page P2, the bit value included in the page P3, and the bit value included in the page P4, respectively.

During the program process, the threshold voltage of the memory cell MT to be programmed is controlled to belong to one of the 32 states S0 to S31 corresponding to the data to be programmed therein. The threshold voltage of the plurality of memory cells MT in the page or block after the program process may be represented as 32 distributions, each having a lobe shape illustrated in FIG. 4B, and separated by read voltages (Vread0 to Vread30), where the horizontal axis represents a range of threshold voltages, from low to high, and the vertical axis represents the number of memory cells that have the threshold voltages represented by the horizontal axis. A memory cell MT programmed in PLC mode is also referred to as a penta-level cell (PLC).

The correspondence between the state and the data in the PLC mode is not limited to the example illustrated in FIG. 4B. Further, in FIG. 4B, for example, when the read voltage, Vr0, is set to 0 V, the control range of the threshold voltages (the range from Vmin to Vmax) is set from a negative region to a positive region. The setting of the control range of the threshold voltage is not limited thereto. For example, the control range of the threshold voltages may be set only in the positive region.

Comparing FIGS. 4A and 4B, the PLC mode has a larger number of peaks in the threshold voltage distribution and a narrower gap between the peaks in the threshold voltage distribution than in the QLC mode. Thus, the PLC mode is more susceptible to program disturb and VPASS disturb (to be described later) than the QLC mode. As a result, when a penta-level cell (PLC) is provided in the memory cell array 130, a device for improving the disturb resistance is required.

Figure 5:
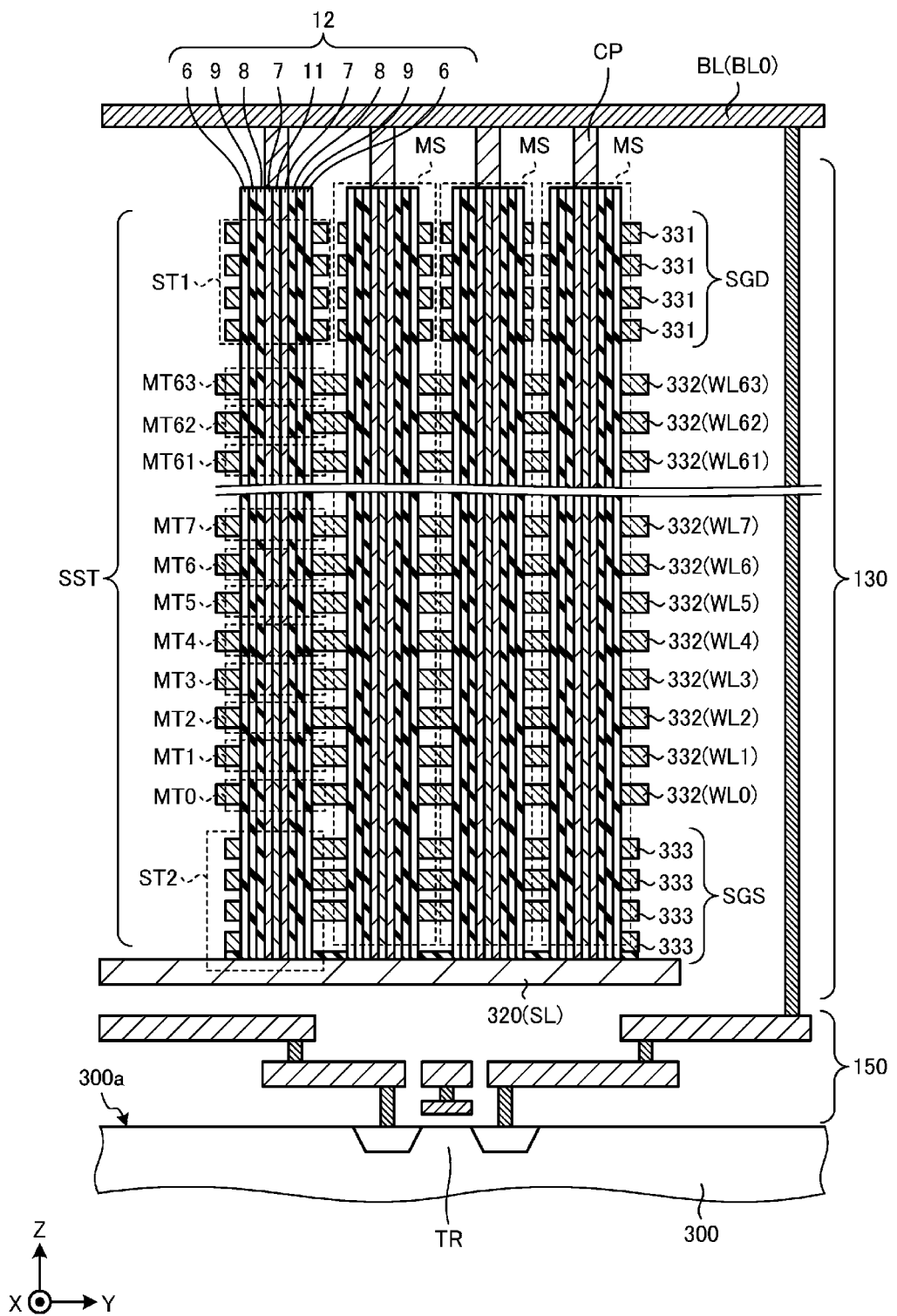
FIG. 5 is a cross-sectional view illustrating the configuration of a memory cell array according to the embodiment.

Next, the configuration of the memory cell array 130 will be described with reference to FIG. 5. FIG. 5 is a cross-sectional view illustrating the configuration of the memory cell array, in which the insulating layer and the interlayer insulating film are omitted for the sake of simplicity. In the following description, a direction perpendicular to a surface 300a of a substrate 300 is defined as the Z direction, and two directions orthogonal to each other in the plane perpendicular to the Z direction are defined as the X direction and the Y direction.

In the semiconductor device 100, a plurality of conductive layers 333, 332, and 331 is stacked via an insulating layer to form a stack SST. Each of the conductive layers 333, 332, and 331 has a plate shape extending in the XY direction.

The stack SST is penetrated by a plurality of columnar bodies 12. Each columnar body 12 extends in the Z direction in the stack SST. The columnar insulator 11 extends in a columnar shape in the Z direction in the stack SST. The channel semiconductor film 7 extends, outside the columnar insulator 11, cylindrically in the Z direction through the stack SST. The tunnel insulating film 8 extends, outside the channel semiconductor film 7, cylindrically in the Z direction through the stack SST. The charge storage film 9 extends, outside the tunnel insulating film 8, cylindrically in the Z direction through the stack SST. The block insulating film 6 extends, outside the charge storage film 9, cylindrically in the Z direction through the stack SST.

The plurality of conductive layers 332 stacked via the insulating layer in the Z direction function as a plurality of word lines WL0 to WL63. The plurality of columnar bodies 12 are arranged in the XY direction (see FIG. 2). A plurality of memory cells MT0 to MT63 is formed at positions where the plurality of conductive layers 332 and the channel semiconductor films 7 of the plurality of columnar bodies 12 intersect. The conductive layers 331 stacked on the +Z side of the plurality of conductive layers 332 function as the drain side select gate lines SGD, and the conductive layers 333 stacked on the −Z side of the plurality of conductive layers 332 function as the source side select gate lines SGS. A plurality of select transistors ST1 is formed at positions where the conductive layers 331 and the channel semiconductor films 7 of the plurality of columnar bodies 12 intersect, and a plurality of select transistors ST2 is formed at positions where the conductive layers 333 and the channel semiconductor films 7 of the plurality of columnar bodies 12 intersect. The select transistors ST2, the memory cells MT0 to MT63, and the select transistors ST1 formed at positions where the plurality of conductive layers 333, 332, and 331 and the channel semiconductor film 7 of one columnar body 2 intersect are arranged in the Z direction and constitute the memory string MS. A plurality of memory strings MS is arranged in the XY direction. As a result, the three-dimensional memory cell array 130 is formed.

Further, a peripheral circuit 150 (see FIG. 1) is formed by a transistor TR having a CMOS structure on the −Z side of the memory cell array 130. In FIG. 5, the structure of the semiconductor device 100 is a CMOS under array (CUA) structure in which a peripheral circuit region is set below the memory cell array region.

Figure 6:
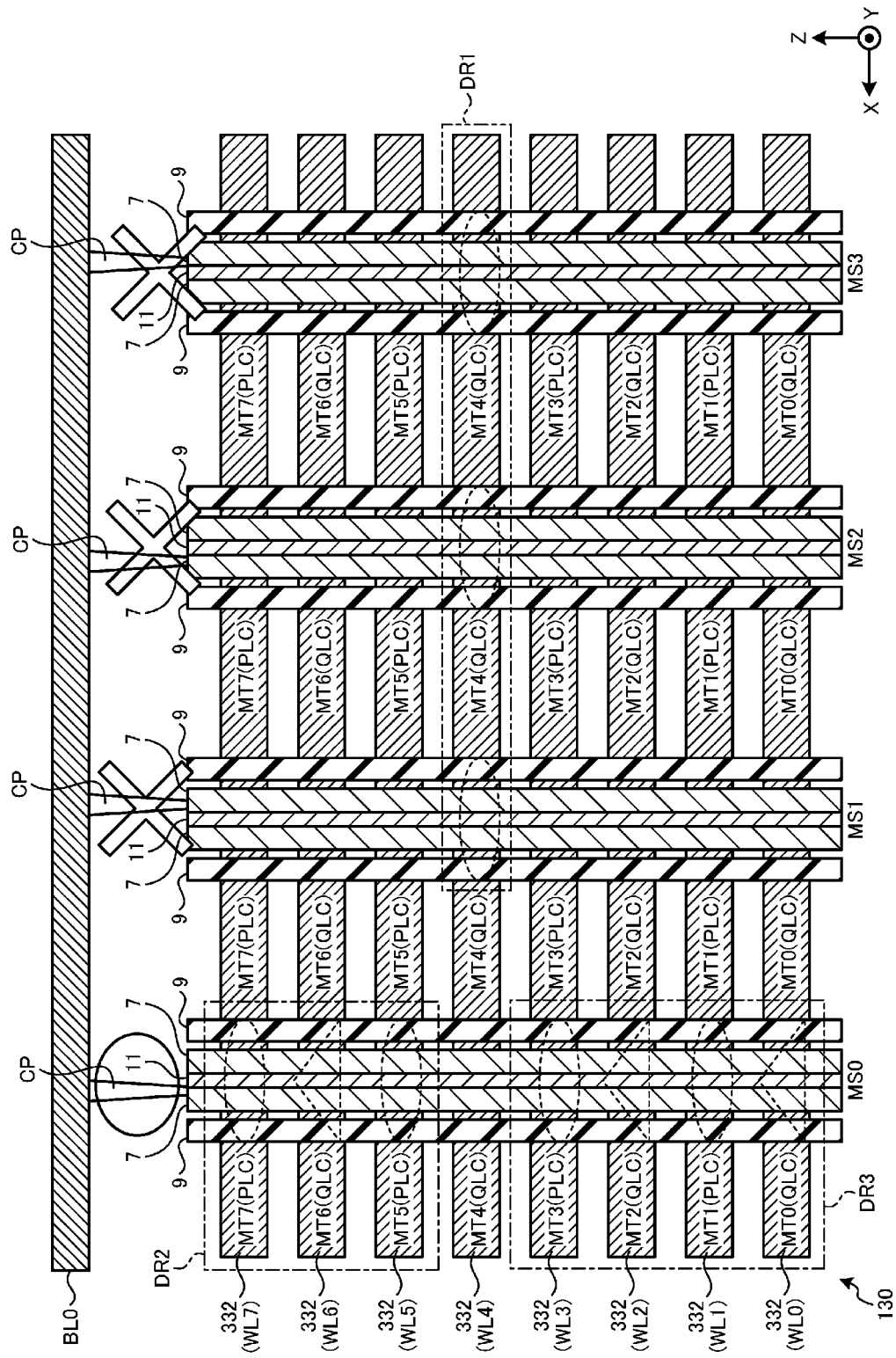
FIG. 6 is a cross-sectional view illustrating the configuration of memory strings that are aligned along a bit line direction according to the embodiment.
Figure 7:
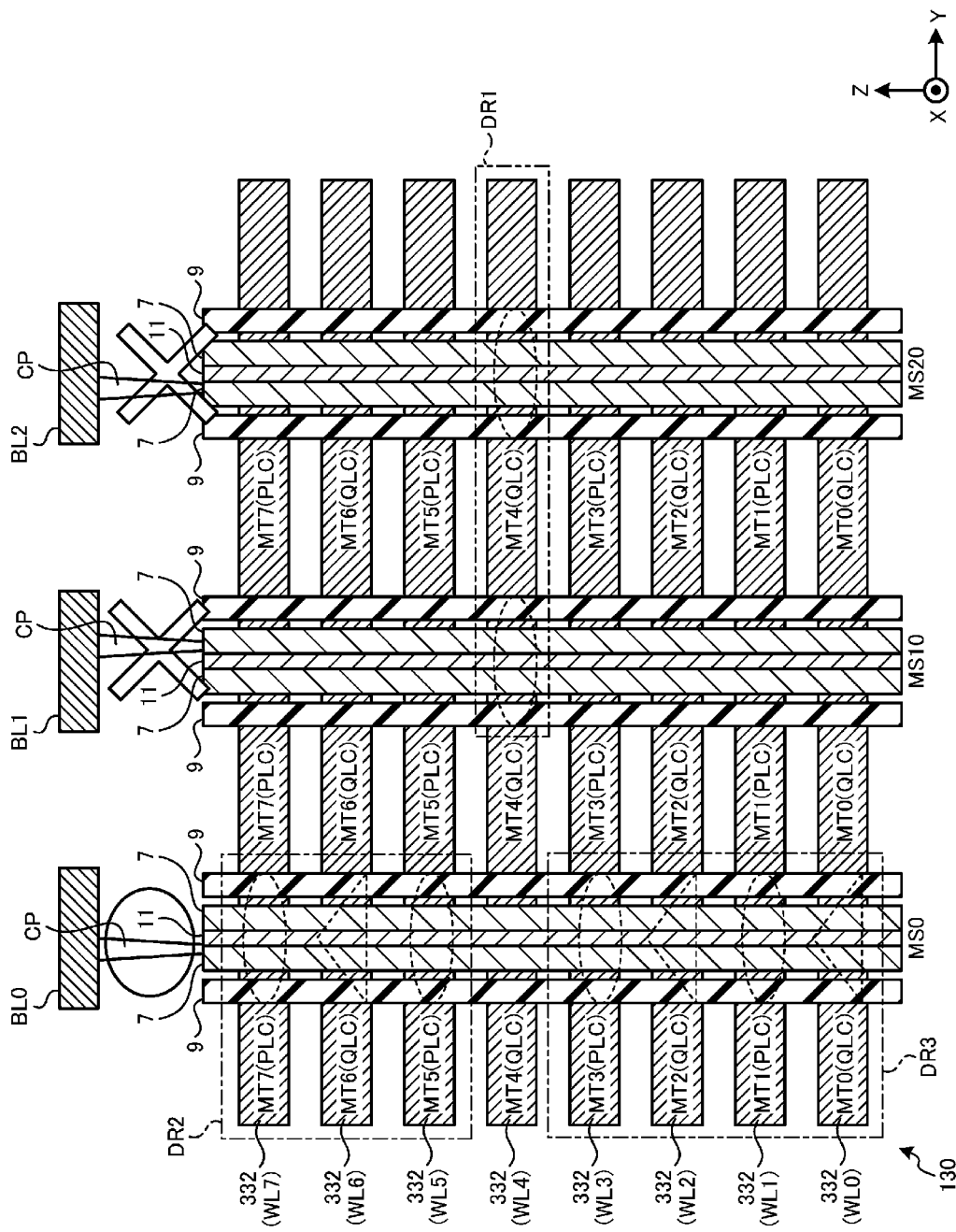
FIG. 7 is a cross-sectional view illustrating the configuration of memory strings that are aligned along a direction perpendicular to the bit line direction according to the embodiment.

In the memory cell array 130, memory cells MT having different numbers of bits that may be stored therein are alternately arranged in each memory string MS extending in the Z direction. For example, as illustrated in FIGS. 6 and 7, in a plurality of memory cells MT provided in the memory strings MS0 to MS3 arranged in the X direction, a quad-level cell (QLC) and a penta-level cell are alternately arranged from the −Z side to the +Z side. FIG. 6 is an XZ cross-sectional view illustrating the configuration of a plurality of memory cells MT in the memory string MS, and illustrates a plurality of memory strings MS0, MS1, MS2, and MS3 (see FIG. 2) arranged in the X direction. FIG. 7 is a YZ cross-sectional view illustrating the configuration of a plurality of memory cells MT in the memory string MS, and illustrates a plurality of memory strings MS0, MS10, and MS20 (see FIG. 2) arranged in the Y direction. In FIGS. 6 and 7, for the sake of simplicity, the interlayer insulating film, the select gate lines SGS and SGD (see FIG. 5), and the block insulating film 6 and the tunnel insulating film 8 in each memory string MS are not illustrated.

In the examples of FIGS. 6 and 7, in the memory cells MT0 to MT7 in the memory strings MS0 to MS3, MS10, and MS20, the QLC and the PLC are alternately arranged from the −Z side to the +Z side. In each of the memory string MS0 to MS3, MS10, and MS20, the memory cells MT0, MT1, MT2, MT3, MT4, MT5, MT6, and MT7 are QLC, PLC, QLC, PLC, QLC, PLC, QLC, and PLC, respectively.

In the plurality of word lines WL0 to WL7 in the memory cell array 130, word lines for the QLC and the PLC alternately correspond from the −Z side to the +Z side. The word lines WL0, WL1, WL2, WL3, WL4, WL5, and WL7 correspond to word lines for QLC, PLC, QLC, PLC, QLC, PLC, QLC, and PLC, respectively.

In each memory string MS, the QLC and the PLC are configured to be arranged alternately in the Z direction for a plurality of memory cells MT, so that the QLCs having a higher disturb resistance may be positioned on both sides of the PLC in the Z direction. As a result, the disturb resistance of the memory cell array 130 as a whole may be improved.

Figure 8:
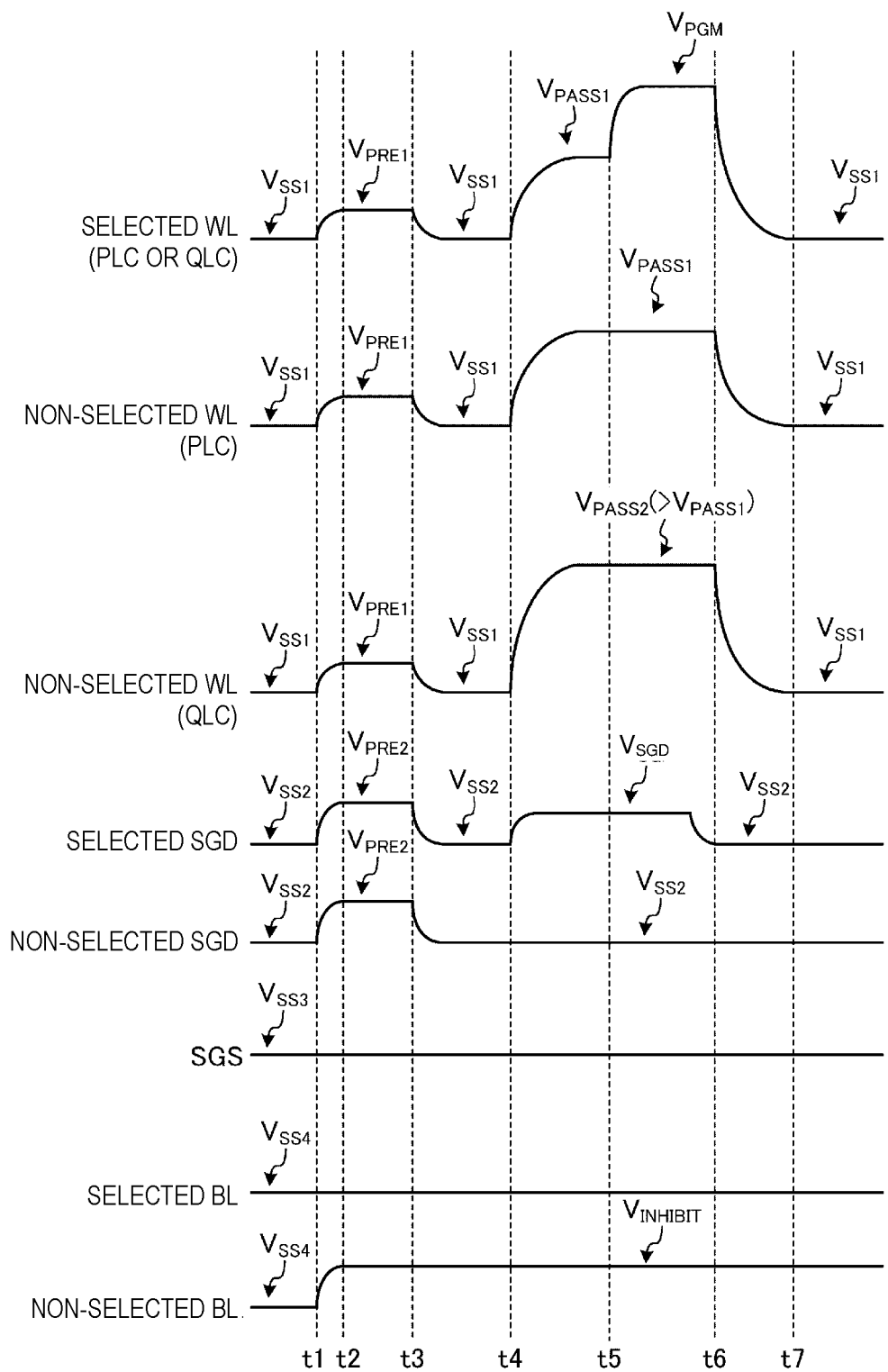
FIG. 8 is a waveform diagram illustrating the operation of the semiconductor device according to the embodiment.

In the memory cell array 130 illustrated in FIGS. 6 and 7, a program operation for the selected memory cell MT is performed as illustrated in FIG. 8. FIG. 8 is a view illustrating the operation of the semiconductor device 100. The application of each voltage illustrated in FIG. 8 may be performed by the peripheral circuit 150 (see FIG. 1).

In the following description, the word line W connected to the page targeted for program operation is referred to as a selected word line WL, and the other word lines are referred to as non-selected word lines. The memory cell MT whose threshold voltage needs to be increased on the page targeted for program operation is referred to as a selected memory cell MT, and the memory string including the selected memory cell MT is referred to as a selected memory string MS. Similarly, the memory cell MT whose threshold voltage needs to be maintained on the page targeted for program operation is referred to as a non-selected memory cell MT, and the memory string MS including the non-selected memory cell MT is referred to as a non-selected memory string MS. A memory cell MT belonging to a page that is not targeted for program operation is also referred to as a non-selected memory cell MT. The bit line BL connected to the selected memory string MS is referred to as a selected bit line BL, and the bit line connected to the non-selected memory string MS is referred to as a non-selected bit line BL.

Immediately before timing t1, each word line WL, each drain side select gate line SGD, each source side select gate line SGS, and each bit line BL are maintained at reference voltages $V_{SS1}$, $V_{SS2}$, $V_{SS3}$, and $V_{SS4}$, respectively. The reference voltages $V_{SS1}$, $V_{SS2}$, $V_{SS3}$, and $V_{SS4}$ may be equal or may be a mixture of different voltages. Each of the reference voltages $V_{SS1}$, $V_{SS2}$, $V_{SS3}$, and $V_{SS4}$ is, for example, 0 V (ground voltage).

During the period from timings t1 to t2, each word line WL transitions to a pre-charge voltage $V_{PRE1}$, each drain side select gate line SGD transitions to a pre-charge voltage $V_{PRE2}$, and the non-selected bit line BL transitions to a write-inhibited voltage $V_{INHIBIT}$. The pre-charge voltages $V_{PRE1}$ and $V_{PRE2}$ may be equal to or different from each other.

During the period from timings t2 to t3, each word line WL is maintained at the pre-charge voltage $V_{PRE1}$, each drain side select gate line SGD is maintained at the pre-charge voltage $V_{PRE2}$, and the non-selected bit line BL is maintained at the write-inhibited voltage $V_{INHIBIT}$. The write-inhibited voltage $V_{INHIBIT}$ is, for example, 2.5 V. Further, the selected bit line BL is maintained at the reference voltage $V_{SS4}$ as a selected voltage.

During the period from timings t3 to t4, each word line WL is returned from the pre-charge voltage $V_{PRE1}$ to the reference voltage $V_{SS1}$, and each drain side select gate line SGD is returned from the pre-charge voltage $V_{PRE2}$ to the reference voltage $V_{SS2}$.

During the period from timings t4 to t5, the selected word line WL transitions to a program pass voltage $V_{PASS1}$, the non-selected word line WL corresponding to the PLC transitions to the program pass voltage $V_{PASS1}$, the non-selected word line WL corresponding to the QLC transitions to a program pass voltage $V_{PASS2}$, and the selected drain side select gate line SGD transitions to the selected voltage $V_{SGD}$.

Both the program pass voltage $V_{PASS1}$ and the program pass voltage $V_{PASS2}$ are voltages for turning on the non-selected memory cell MT without accumulating charges in the charge storage film of the non-selected memory cell MT corresponding to the non-selected word line WL and the selected memory string MS. The selected voltage $V_{SGD}$ is a voltage for turning on the select transistor ST1 corresponding to the selected bit line BL and turning off the select transistor ST1 corresponding to the non-selected bit line BL. In the non-selected memory string MS in which the select transistor ST1 is turned off, by coupling the channel semiconductor film 7 in an electrically floating state with the selected word line WL/non-selected word line WL, the channel semiconductor film 7 may be boosted to a predetermined voltage according to the program pass voltage $V_{PASS1}$ and the program pass voltage $V_{PASS2}$.

Here, the program pass voltage $V_{PASS2}$ is higher than the program pass voltage $V_{PASS1}$. Thus, when the QLC and the PLC coexist in the memory cell array 130, it is possible to reduce the difference in the susceptibility to the disturb (e.g., a program disturb, a VPASS disturb, etc.) between the QLC and the PLC, thereby improving the disturb resistance of the memory cell array 130 as a whole.

During the period from timings t5 to t6, the selected word line WL transitions to a program voltage $V_{PGM}$. The program voltage $V_{PGM}$ is a voltage for accumulating charges in the charge storage film of the selected memory cell MT corresponding to the selected word line WL and the selected memory string MS, and is, for example, 20 V.

During the period from timings t6 to t7, the selected word line WL transitions from the program voltage $V_{PGM}$ to the reference voltage $V_{SS1}$, and the non-selected word line WL corresponding to the PLC transitions from the program pass voltage $V_{PASS1}$ to the reference voltage $V_{SS1}$, the non-selected word line WL corresponding to the QLC transitions from the program pass voltage $V_{PASS2}$ to the reference voltage $V_{SS1}$, and the selected drain side select gate line SGD transitions from the selected voltage $V_{SGD}$ to the reference voltage $V_{SS2}$. As a result, the program operation to the memory cell MT is completed.

During the period from the timings t1 to t7, the source side select gate line SGS is maintained at the reference voltage $V_{SS3}$.

Next, the program disturb and the VPASS disturb will be described with reference to FIGS. 2 and 6 to 8. For example, among the bit lines BL0 to BL2 illustrated in FIGS. 2, 6, and 7, the selected voltage $V_{SS4}$ (e.g., 0 V) is applied to the bit line BL0, and the write-inhibited voltage $V_{INHIBIT}$ (e.g., 2.5 V) is applied to the other bit lines BL1 and BL2. Among the drain side select gate lines SGD0 to SGD3 illustrated in FIG. 2, the selected voltage $V_{SGD}$ (e.g., 2.5 V) is applied to the drain side select gate line SGD0, and the non-selected voltage $V_{SS2}$ (e.g., 0 V) is applied to the other drain side select gate lines SGD1, SGD2, and SGD3.

As a result, the select transistor ST1 at the position indicated by the symbol "O" is turned on in the vicinity of a contact plug CP in FIGS. 6 and 7, and the select transistor ST1 at the position indicated by the symbol "X" is turned off. That is, the select transistor ST1 of the selected memory string MS0 at the XY position where the selected bit line BL0 and the selected drain side select gate line SGD0 intersect is turned on, and the select transistor ST1 of the non-selected memory strings MS1, MS2, MS3, MS10, and MS20 are turned off.

For example, when the selected memory cell of the selected memory string MS0 performs programming on the memory cell MT4, the program pass voltage $V_{PASS1}$ is applied to the selected word line WL4 and the non-selected word lines WL1, WL3, WL5, and WL7 at the timing t4 (see FIG. 8), and the program pass voltage $V_{PASS2}$ ($>V_{PASS1}$) is applied to the non-selected word lines WL0, WL2, WL4, and WL6. At the timing t5 (see FIG. 8), the voltage of the selected word line WL4 transitions from the program pass voltage $V_{PASS1}$ to the program voltage $V_{PGM}$.

At this time, the memory cells MT arranged in a region DR1 are susceptible to the program disturb, and the memory cells MT arranged in regions DR2 and DR3 are susceptible to the VPASS disturb.

The region DR1 is a region corresponding to a position where the selected word line WL4 and the non-selected memory strings MS1, MS2, MS3, MS10, and MS20 intersect. In the region DR1, the memory string MS is non-selected and the channel region of the memory cell MT4 is boosted to a predetermined voltage. However, since the program voltage $V_{PGM}$ is applied to the word line WL4 during the period from the timings t5 to t6 (see FIG. 8), voltage stress is applied. Due to the influence of the electric field stress, the data of the memory cell MT4 may change.

That is, there is a possibility that unintentional accumulation of charges known as program disturb may occur in the memory cell MT4.

The channel semiconductor film 7 of the non-selected memory strings MS1, MS2, MS3, MS10, and MS20 is boosted as a result of the program pass voltage $V_{PASS1}$ and the program pass voltage $V_{PASS2}$ higher than the program pass voltage $V_{PASS1}$ being applied to memory cells of these non-selected memory strings during the period from the timings t4 to t5 (see FIG. 8). Thus, the channel semiconductor film 7 may be boosted to a higher voltage $V_{PASS2}$ (i.e., a voltage closer to the program voltage $V_{PGM}$) than when uniformly boosted to the program pass voltage $V_{PASS1}$. Therefore, the electric field stress applied to the memory cells MT4 of the non-selected memory strings MS1, MS2, MS3, MS10, and MS20 may be alleviated during the period from the timings t5 to t6 (see FIG. 8). As a result, the program disturb resistance may be improved as indicated by the dotted circles in FIGS. 6 and 7.

The regions DR2 and DR3 are regions corresponding to the positions where the non-selected word lines WL0 to WL3 and WL5 to WL7 intersect with the selected memory string MS0. In the regions DR2 and DR3, the memory string MS is selected and the channel regions of the memory cells MT0 to MT3 and MT5 to MT7 are set to the reference voltage $V_{SS4}$ (e.g., 0 V). However, since the program pass voltage is applied to the word line WL during the period from the timings t4 to t6 (see FIG. 8), the voltage stress is applied. Due to the influence of the electric field stress, the data of the memory cells MT0 to MT3 and MT5 to MT7 may change as a result of unintended accumulation of charges in these memory cells. That is, the VPASS disturb may occur in the memory cells MT0 to MT3 and MT5 to MT7.

The program pass voltage $V_{PASS2}$ applied to the word lines WL0, WL2, WL4, and WL6 of the memory cells MT0, MT2, MT4, and MT6 of the QLC is higher than the program pass voltage $V_{PASS1}$ applied to the word lines WL1, WL3, WL5, and WL7 of the memory cells MT1, MT3, MT5, and MT7 of the PLC. Thus, in the regions DR2 and DR3, the electric field stress of the memory cells MT1, MT3, MT5 and MT7 of the PLC may be made smaller than the electric field stress of the memory cells MT0, MT2, MT4 and MT6 of the QLC. That is, the program pass voltage for boosting the channel semiconductor film 7 to a higher voltage is only applied to word lines of the QLC (see FIGS. 4A and 4B) having a higher disturb resistance than the PLC. As a result, the VPASS disturb resistance of the memory cell array 130 as a whole may be improved.

As described above, in the embodiment, in the semiconductor device 1, the memory cells MT having different numbers of bits that may be stored in the memory cell array 130 are alternately mixed and configured in the Z direction, and the peripheral circuit 150 applies a relatively high program pass voltage to the memory cells MT having a smaller number of bits that may be stored among the plurality of non-selected memory cells MT. As a result, a relatively high program pass voltage for alleviating the program disturb is applied to the memory cell MT having a higher disturb resistance. As a result, the disturb (e.g., a program disturb, a VPASS disturb, etc.) resistance of the memory cell array 130 VPGM may be improved.

Figure 9:
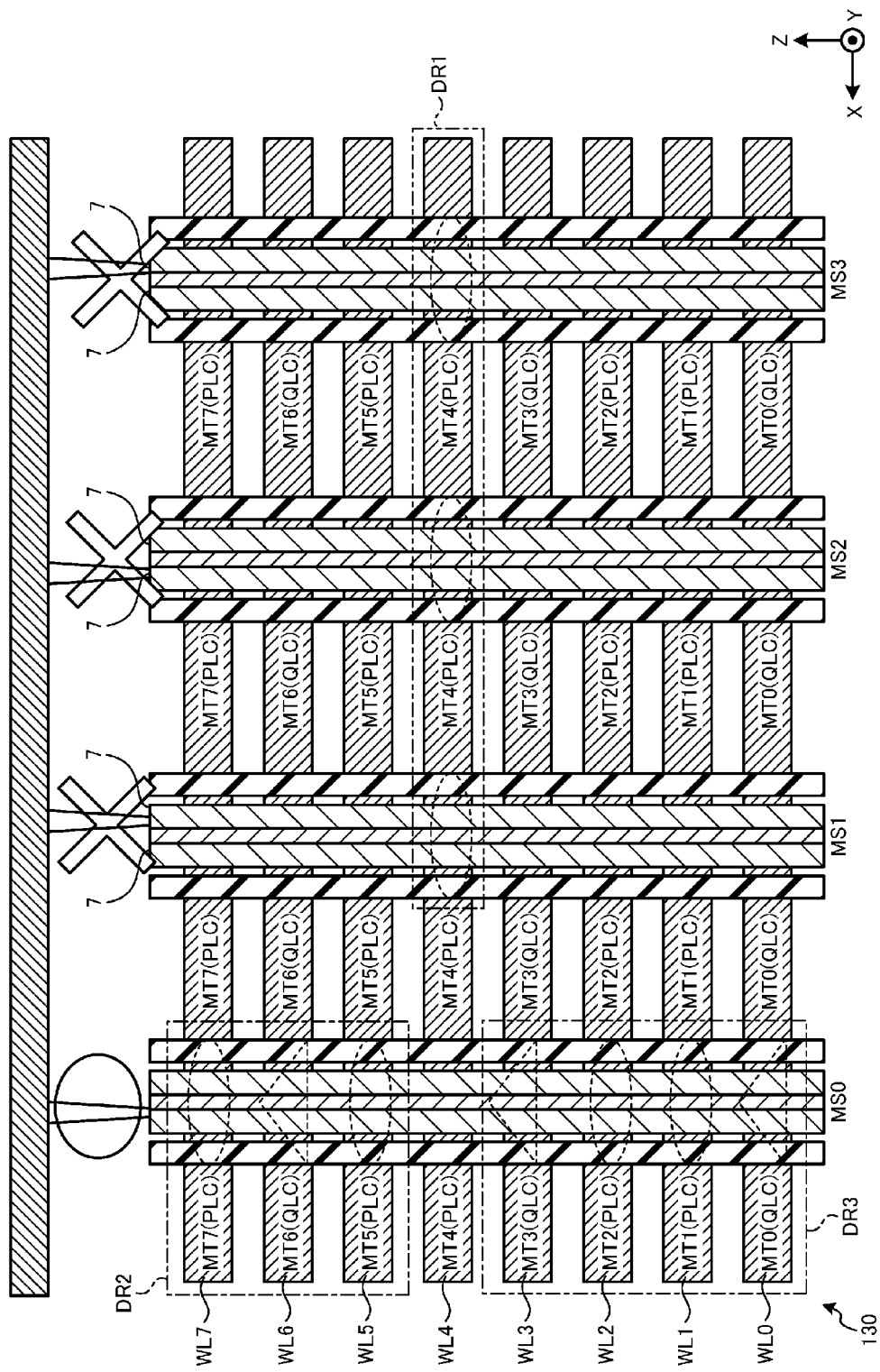
FIG. 9 is a cross-sectional view illustrating the configuration of a memory string according to a first modification of the embodiment.

As a first modification of the embodiment, one QLC and two PLCs may be repeatedly arranged in each memory string MS as illustrated in FIG. 9. FIG. 9 is a cross-sectional view illustrating the configuration of the memory string MS in the first modification of the embodiment.

In the example of FIG. 9, in the memory cells MT0 to MT7 in the memory strings MS0 to MS3, one QLC and two PLCs are repeatedly arranged from the −Z side to the +Z side. In each of the memory string MS0 to MS3, the memory cells MT0, MT1, MT2, MT3, MT4, MT5, MT6, and MT7 are QLC, PLC, PLC, QLC, PLC, PLC, QLC, and PLC, respectively.

In the plurality of word lines WL0 to WL7 in the memory cell array 130, the word lines WL0, WL1, WL2, WL3, WL4, WL5, WL6, and WL7 are word lines for QLC, PLC, PLC, QLC, PLC, PLC, QLC, and PLC, respectively.

In each memory string MS, one QLC and two PLCs are repeatedly arranged in the Z direction for a plurality of memory cells MT, so that the QLC with a higher disturb resistance may be positioned next to the PLC in the Z direction. This also makes it possible to improve the disturb resistance of the memory cell array 130 as a whole.

For example, when the selected memory cell of the selected memory string MS0 performs programming on the memory cell MT4, in the region DR1, the channel semiconductor film 7 of the non-selected memory strings MS1, MS2, and MS3 is boosted as a result of the program pass voltage $V_{PASS1}$ and the program pass voltage $V_{PASS2}$ higher than the program pass voltage $V_{PASS1}$ being applied to memory cells of these non-selected memory strings during the period from the timings t4 to t5 (see FIG. 8). Thus, the channel semiconductor film 7 may be boosted to a higher voltage $V_{PASS2}$ (i.e., a voltage closer to the program voltage $V_{PGM}$) than when uniformly boosted to the program pass voltage $V_{PASS1}$. Therefore, the electric field stress applied to the memory cells MT4 of the non-selected memory strings MS1, MS2, and MS3 may be alleviated during the period from the timings t5 to t6 (see FIG. 8). As a result, the program disturb resistance may be improved as indicated by the dotted circles in FIGS. 6 and 7.

In the regions DR2 and DR3, the program pass voltage $V_{PASS2}$ applied to the word lines WL0, WL3, and WL6 of the memory cells MT0, MT3, and MT6 of the QLC is higher than the program pass voltage $V_{PASS1}$ applied to the word lines WL1, WL2, WL5, and WL7 of the memory cells MT1, MT2, MT5, and MT7 of the PLC. Thus, in the regions DR2 and DR3, the electric field stress of the memory cells MT1, MT2, MT5 and MT7 of the PLC may be made smaller than the electric field stress of the memory cells MT0, MT3, and MT6 of the QLC. That is, the program pass voltage for boosting the channel semiconductor film 7 to a higher voltage is only applied to word lines of the QLC (see FIGS. 4A and 4B) having a higher disturb resistance than the PLC. As a result, the VPASS disturb resistance of the memory cell array 130 as a whole may be improved.

Figure 10:
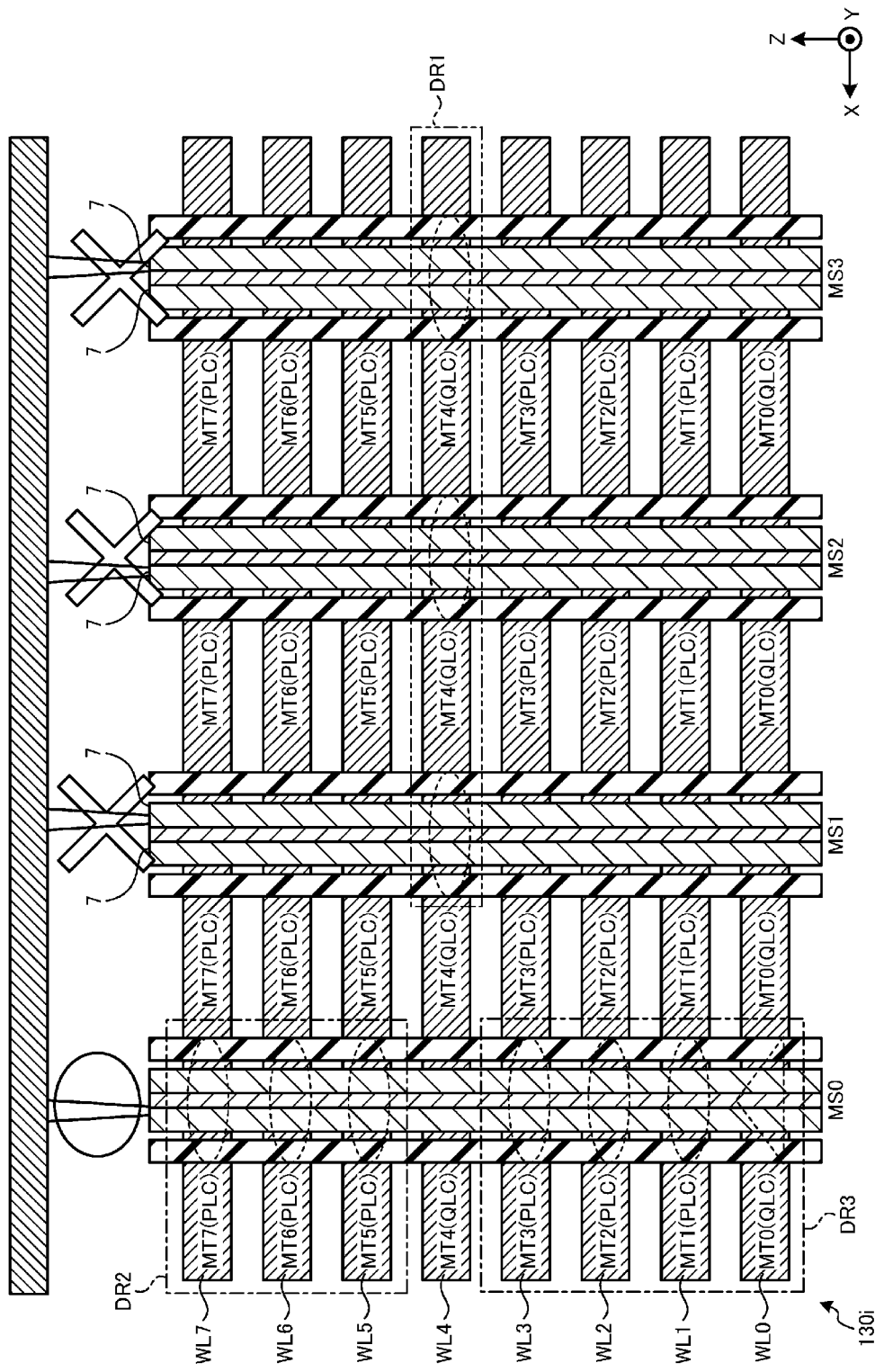
FIG. 10 is a cross-sectional view illustrating the configuration of a memory string according to a second modification of the embodiment.

Alternatively, as a second modification of the embodiment, one QLC and N (N is an integer of 3 or more) PLCs may be repeatedly arranged in each memory string MS as illustrated in FIG. 10. FIG. 10 is a cross-sectional view illustrating the configuration of the memory string MS in the second modification of the embodiment, and the case of N=3 is exemplified therein.

In the example of FIG. 10, in the memory cells MT0 to MT7 in the memory strings MS0 to MS3, one QLC and three PLCs are repeatedly arranged from the −Z side to the +Z side. In each of the memory string MS0 to MS3, the memory cells MT0, MT1, MT2, MT3, MT4, MT5, MT6, and MT7 are QLC, PLC, PLC, PLC, QLC, PLC, PLC, and PLC, respectively.

In the plurality of word lines WL0 to WL7 in a memory cell array 130i, the word lines WL0, WL1, WL2, WL3, WL4, WL5, WL6, and WL7 are word lines for QLC, PLC, PLC, PLC, QLC, PLC, PLC, and PLC, respectively.

In this way, in each memory string MS, one QLC and N PLCs are repeatedly arranged in the Z direction for a plurality of memory cells MT, so that the QLC with a higher disturb resistance may be positioned next to the N PLCs at both ends in the Z direction. As a result, it possible to improve the disturb resistance of the memory cell array 130*i* as a whole.

For example, when the selected memory cell of the selected memory string MS0 performs programming on the memory cell MT4, in the region DR1, the channel semiconductor film 7 of the non-selected memory strings MS1, MS2, and MS3 is boosted as a result of the program pass voltage $V_{PASS1}$ and the program pass voltage $V_{PASS2}$ higher than the program pass voltage $V_{PASS1}$ being applied to memory cells of these non-selected memory strings during the period from the timings t4 to t5 (see FIG. 8). Thus, the channel semiconductor film 7 may be boosted to a higher voltage (i.e., a voltage closer to the program voltage $V_{PGM}$) than when uniformly boosted to the program pass voltage $V_{PASS1}$. Therefore, the electric field stress applied to the memory cells MT4 of the non-selected memory strings MS1, MS2, and MS3 may be alleviated during the period from the timings t5 to t6 (see FIG. 8). As a result, the program disturb resistance may be improved as indicated by the dotted circles in FIGS. 6 and 7.

In the regions DR2 and DR3, the program pass voltage $V_{PASS2}$ applied to the word line WL0 of the memory cell MT0 of the QLC is higher than the program pass voltage $V_{PASS1}$ applied to the word lines WL1, WL2, WL3, WL5, WL6, and WL7 of the memory cells MT1, MT2, MT3, MT5, MT6, and MT7 of the PLC. Thus, in the regions DR2 and DR3, the electric field stress of the memory cells MT1, MT2, MT3, MT5, MT6, and MT7 of the PLC may be made smaller than the electric field stress of the memory cell MT0 of the QLC. That is, the program pass voltage for boosting the channel semiconductor film 7 to a higher voltage is only applied to word lines of the QLC (see FIGS. 4A and 4B) having a higher disturb resistance than the PLC. As a result, the VPASS disturb resistance of the memory cell array 130*i* as a whole may be improved.

Figure 11:
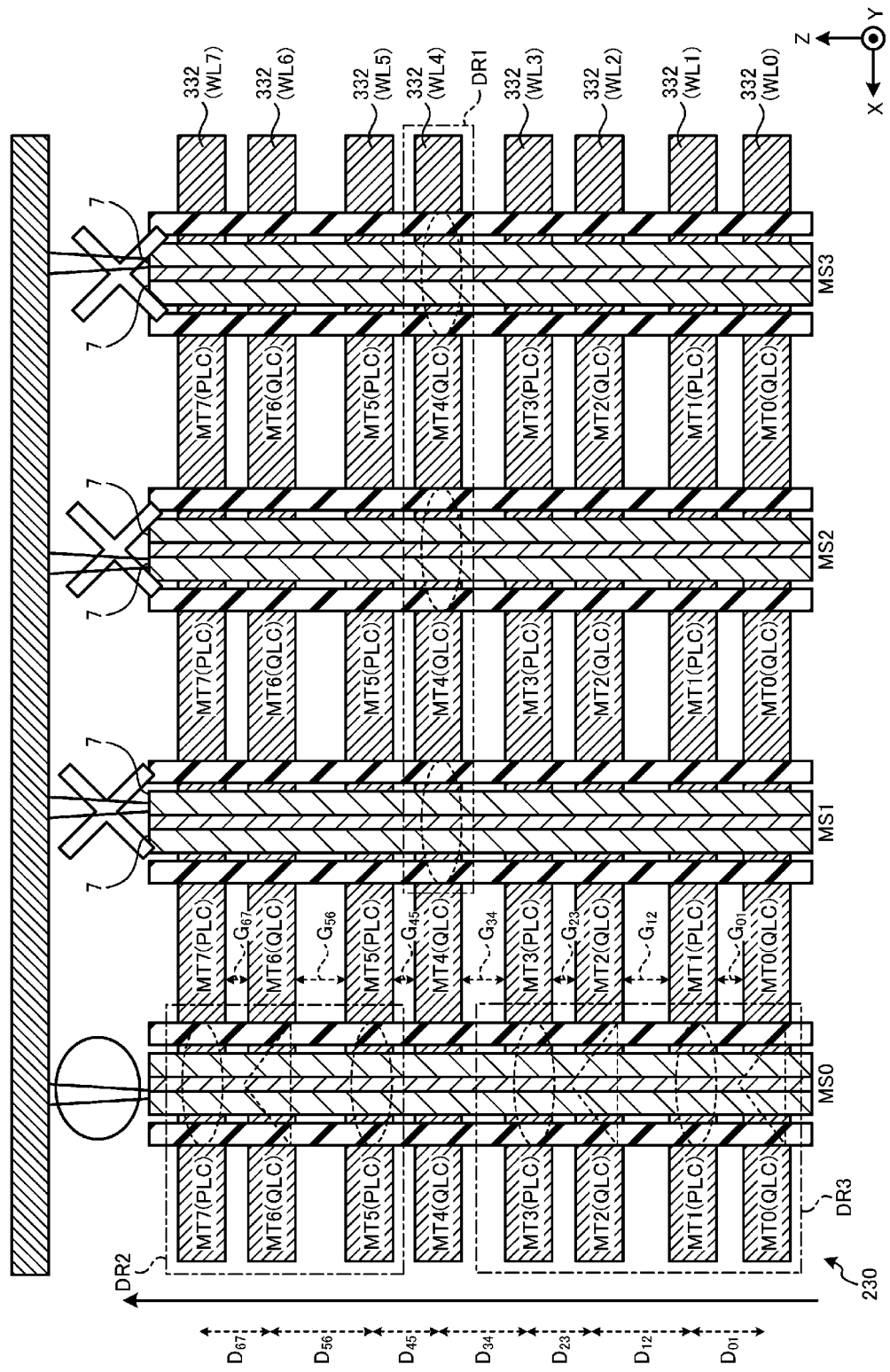
FIG. 11 is a cross-sectional view illustrating the configuration of a memory string according to a third modification of the embodiment.

Alternatively, in a third modification of the embodiment, the Z distances of the plurality of memory cells MT vary as illustrated in FIG. 11. FIG. 11 is a cross-sectional view illustrating the configuration of the memory string MS in the third modification of the embodiment.

In the semiconductor device 100 having the structure of FIG. 11, the program operation is sequentially performed from the memory cell MT on the −Z side to the memory cell MT on the +Z side. More specifically, in each string MS of the memory cell array 230, as indicated by the solid line arrow in FIG. 11, the program operation is performed in the order of memory cell MT0→memory cell MT1→memory cell MT2→memory cell MT3→memory cell MT4→memory cell MT5→memory cell MT6→memory cell MT7. As depicted, the spacings between the memory cells MT in the Z direction may alternate between small and large in consideration of the neighboring word line interference (NWI). The NWI is a phenomenon in which the data of the memory cell MT to which the program operation has already been performed may change during the program operation of the adjacent memory cell MT. Because the PLC has a lower overall disturb resistance than the QLC, a spacing between the PLC and the adjacent QLC on the +Z side is made larger than that between the PLC and the adjacent QLC on the −Z side.

In the example of FIG. 11, in each string MS, the QLC and the PLC are alternately arranged from the −Z side to the +Z side. The memory cells MT0, MT1, MT2, MT3, MT4, MT5, MT6, and MT7 are QLC, PLC, QLC, PLC, QLC, PLC, QLC, and PLC, respectively.

In the plurality of word lines WL0 to WL7 in the memory cell array 230, the word lines WL0, WL1, WL2, WL3, WL4, WL5, and WL7 are word lines for QLC, PLC, QLC, PLC, QLC, PLC, QLC, and PLC, respectively.

In the word line WL corresponding to the PLC, a spacing in the Z direction between the word line WL adjacent on the +Z side and corresponding to a word line for the QLC is wider than that between the word line WL adjacent on the −Z side and corresponding to a word line for the QLC. The spacing in the Z direction between the word lines WL0 and WL1 is $G_{01}$; the spacing in the Z direction between the word lines WL1 and WL2 is $G_{12}$; the spacing in the Z direction between the word lines WL2 and WL3 is $G_{23}$; the spacing in the Z direction between the word lines WL3 and WL4 is $G_{34}$; the spacing in the Z direction between the word lines WL4 and WL5 is $G_{45}$; the spacing in the Z direction between the word lines WL5 and WL6 is $G_{56}$; and the spacing in the Z direction between the word lines WL6 and WL7 is $G_{67}$. The relationships between the spacings are defined by the following Equations 1 to 6.

$$G_{12} > G_{01} \qquad \text{Equation 1}$$

$$G_{23} < G_{12} \qquad \text{Equation 2}$$

$$G_{34} > G_{23} \qquad \text{Equation 3}$$

$$G_{45} < G_{34} \qquad \text{Equation 4}$$

$$G_{56} > G_{45} \qquad \text{Equation 5}$$

$$G_{67} < G_{56} \qquad \text{Equation 6}$$

Accordingly, the memory cell MT of the PLC has a wider spacing to the adjacent QLC on the +Z side than that to the adjacent QLC on the −Z side. The Z distance between the memory cells MT0 and MT1 is $D_{01}$; the Z distance between the memory cells MT1 and MT2 is $D_{12}$; the Z distance between the memory cells MT2 and MT3 is $D_{23}$; the Z distance between the memory cells MT3 and MT4 is $D_{34}$; the Z distance between the memory cells MT4 and MT5 is $D_{45}$; the Z distance between the memory cells MT5 and MT6 is $D_{56}$; and the Z distance between the memory cells MT6 and MT7 is $D_{67}$. The relationships between the spacings are defined by the following Equations 7 to 12.

$$D_{12} > D_{01} \qquad \text{Equation 7}$$

$$D_{23} < D_{12} \qquad \text{Equation 8}$$

$$D_{34} > D_{23} \qquad \text{Equation 9}$$

$$D_{45} < D_{34} \qquad \text{Equation 10}$$

$$D_{66} > D_{46} \qquad \text{Equation 11}$$

$$D_{67} < D_{56} \qquad \text{Equation 12}$$

In this way, in each memory string MS of the memory cell array 230, the Z spacings between the plurality of memory cells MT are made different, and the different spacings are set according to the intended order of the program operation. As a result, the influence of the NWI may be alleviated, and the disturb resistance of the memory cell array 230 as a whole may be improved.

For example, when programming is performed on the selected memory cell MT4 of the QLC of the selected memory string MS0, immediately after the memory cell MT3 of the PLC has been programmed, because the previously programmed memory cell MT3, which is subject to NWI, has a larger spacing from the word line WL4 corresponding to the memory cell MT4 than the normal spacing, e.g., spacing between MT3 and WL2. Therefore, it is possible to prevent the influence of the electric field caused by the program voltage $V_{PGM}$ applied to the word line WL4 at the time of programming the selected memory cell MT4, on the previously programmed memory cell MT3. As a result, the disturb resistance resulting from the NWI in the memory cell array 130 as a whole may be improved.

Figure 12:
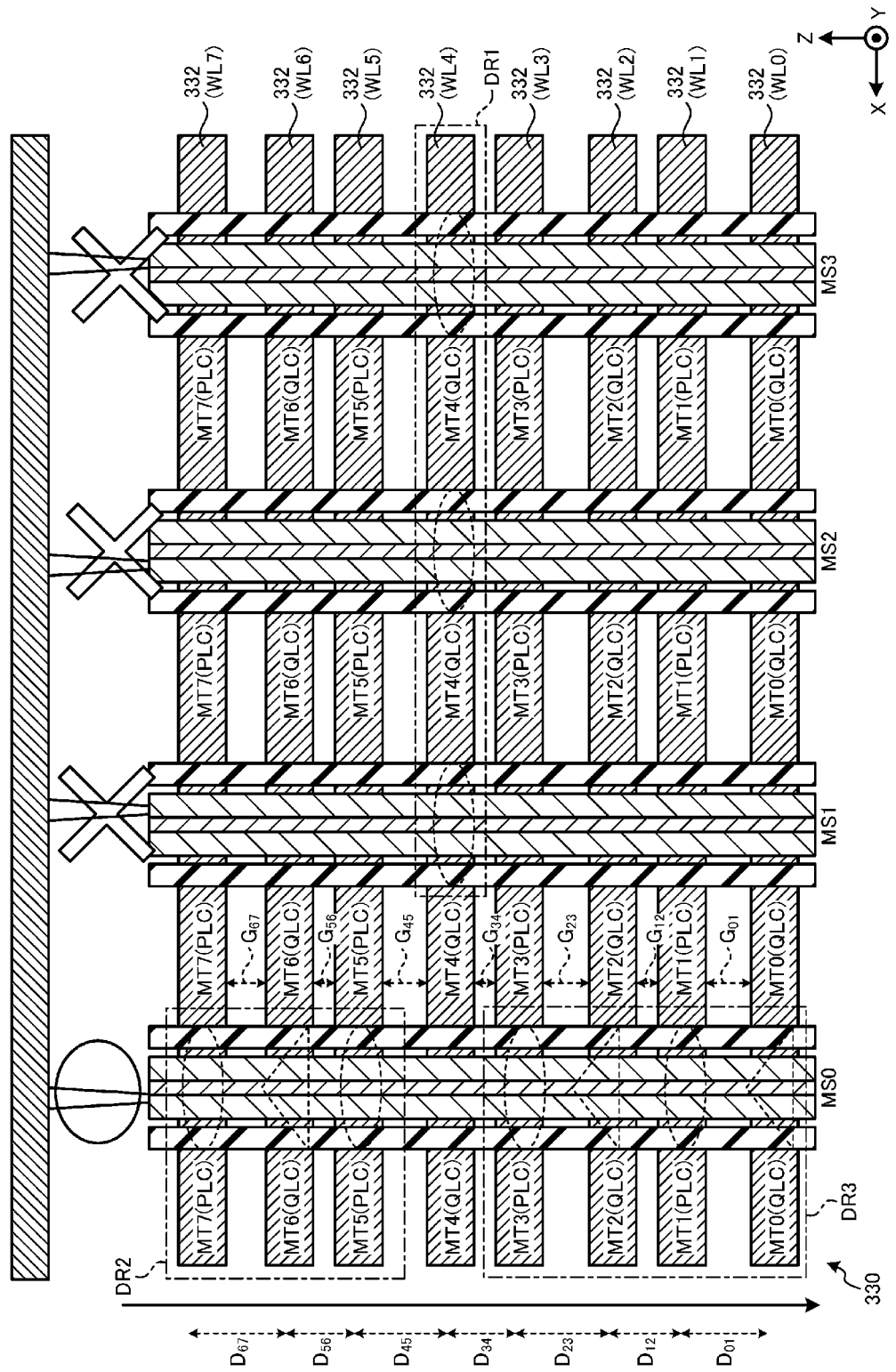
FIG. 12 is a cross-sectional view illustrating the configuration of a memory string according to a fourth modification of the embodiment.

Alternatively, as a fourth modification of the embodiment, as illustrated in FIG. 12, each memory string MS is configured with different spacings between the plurality of memory cells MT as in the third modification. However, in the fourth modification, the different spacings are set according to an order of the program operation that is the reverse of the intended order of the third modification. FIG. 12 is a cross-sectional view illustrating the configuration of the memory string MS in the fourth modification of the embodiment.

In the semiconductor device 100 having the structure of FIG. 12, the program operation is sequentially performed from the memory cell MT on the +Z side to the memory cell MT on the −Z side. More specifically, in each string MS of the memory cell array 330, as indicated by the solid line arrow in FIG. 12, the program operation is performed in the order of memory cell MT→memory cell MT6→memory cell MT5→memory cell MT4→memory cell MT3→memory cell MT2→memory cell MT1→memory cell MT0. As depicted, the spacing between the PLC and the adjacent QLC on the −Z side is made wider than the spacing between the PLC and the adjacent QLC on the +Z side.

For example, the word line WL corresponding to the PLC has a wider spacing in the Z direction to the word line WL adjacent to the −Z side and corresponding to a word line for the QLC than that to the word line WL adjacent to the +Z side and corresponding to a word line for the QLC. The relationships between the spacings are defined by the following Equations 13 to 18.

$$G_{67} > G_{56} \quad \text{Equation 13}$$

$$G_{56} < G_{45} \quad \text{Equation 14}$$

$$G_{45} > G_{34} \quad \text{Equation 15}$$

$$G_{34} < G_{23} \quad \text{Equation 16}$$

$$G_{23} > G_{12} \quad \text{Equation 17}$$

$$G_{12} < G_{01} \quad \text{Equation 18}$$

Accordingly, the memory cell MT of the PLC has a wider spacing to the adjacent QLC on the −Z side than that to the adjacent QLC on the +Z side. The relationships between the spacings are defined by the following Equations 19 to 24.

$$D_{67} > D_{56} \quad \text{Equation 19}$$

$$D_{56} < D_{45} \quad \text{Equation 20}$$

$$D_{45} > D_{34} \quad \text{Equation 21}$$

$$D_{34} < D_{23} \quad \text{Equation 22}$$

$$D_{23} > D_{12} \quad \text{Equation 23}$$

$$D_{12} < D_{01} \quad \text{Equation 24}$$

In this way, in each memory string MS of the memory cell array 330, the Z spacings between the plurality of memory cells MT are made different, and the different spacings are set according to the intended order of the program operation. This may also alleviate the influence of NWI and improve the disturb resistance of the memory cell array 330 as a whole.

For example, when programming is performed on the selected memory cell MT4 of the QLC of the selected memory string MS0, immediately after the memory cell MT5 of the PLC has been programmed, because the previously programmed memory cell MT5, which is subject to NWI, has a larger spacing from the word line WL4 corresponding to the memory cell MT4 than the normal spacing, e.g., spacing between MT5 and WL6. Therefore, it is possible to prevent the influence of the electric field caused by the program voltage $V_{PGM}$ applied to the word line WL4 at the time of programming the selected memory cell MT4, on the previously programmed memory cell MT5. As a result, it is possible to improve the disturb resistance caused by the NWI in the memory cell array 130 as a whole.

Figure 13:
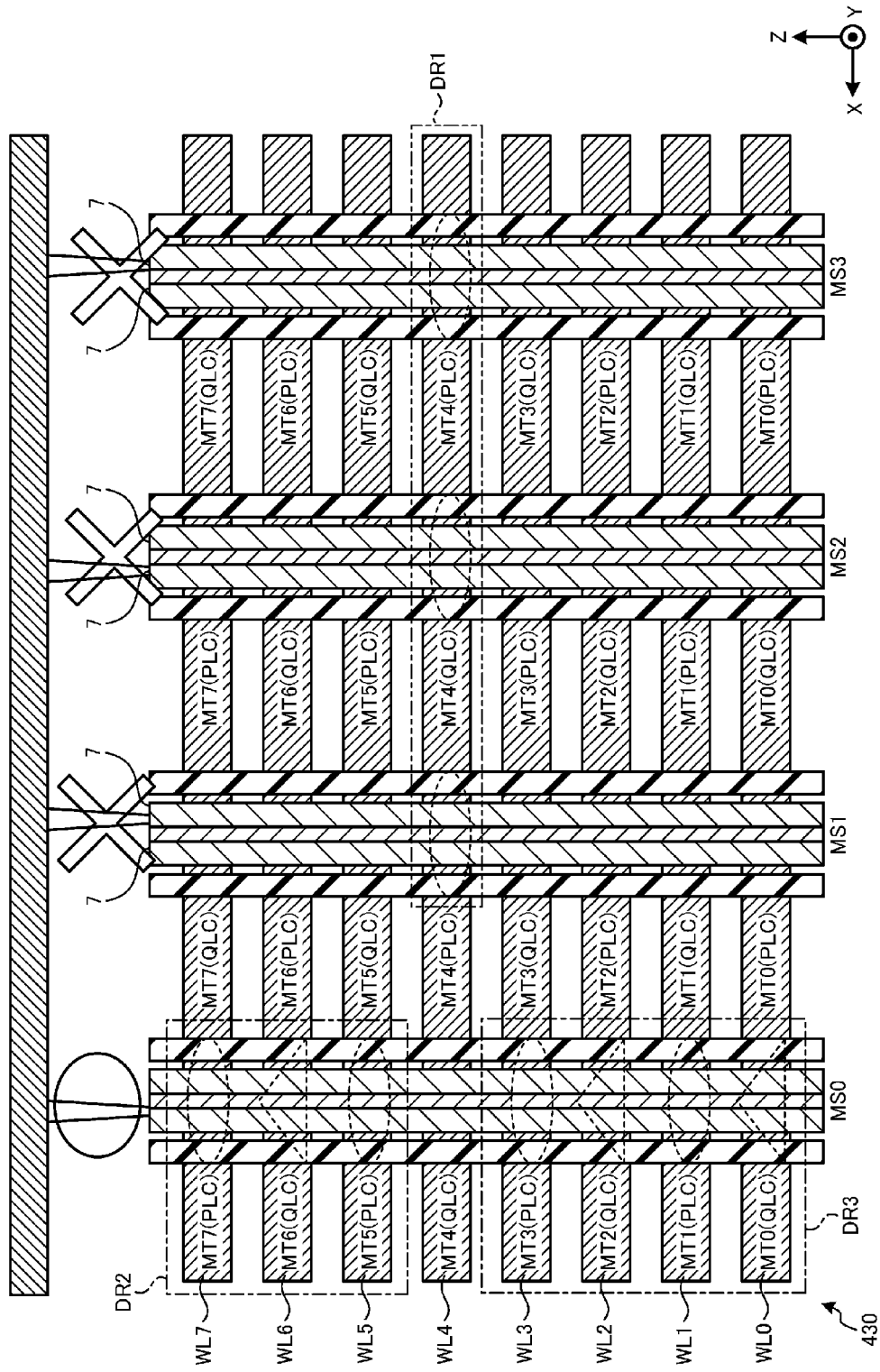
FIG. 13 is a cross-sectional view illustrating the configuration of a memory string according to a fifth modification of the embodiment.

Alternatively, as a fifth modification of the embodiment, the memory cell array 430 may be configured such that the QLC and the PLC are arranged in a mixed manner between adjacent memory strings MS as illustrated in FIG. 13. FIG. 13 is an XZ cross-sectional view illustrating the configuration of a plurality of memory cells MT in the memory string MS according to the fifth modification of the embodiment, and illustrates the plurality of memory strings MS0, MS1, MS2, and MS3 arranged in the X direction (FIG. 2).

In the example of FIG. 13, in each of the memory cells MT0 to MT7 in the plurality of memory strings MS0, MS1, MS2, and MS3 arranged in the X direction, the QLC and the PLC are alternately arranged from the +X side to the −X side. The memory cells MT0 of the plurality of memory strings MS0, MS1, MS2, and MS3 are QLC, PLC, QLC, and PLC, respectively. The memory cells MT1 of the plurality of memory strings MS0, MS1, MS2, and MS3 are PLC, QLC, PLC, and QLC, respectively. The memory cells MT7 of the plurality of memory strings MS0, MS1, MS2, and MS3 are PLC, QLC, PLC, and QLC, respectively.

In the memory cell array 430, the QLC and the PLC are also alternately arranged in the Z direction for the memory cell MT between the adjacent memory strings MS, so that the QLCs having a higher disturb resistance are located on both sides of the PLC in the X direction. As a result, it possible to improve the disturb resistance of the memory cell array 430 as a whole.

For example, when the selected memory cell of the selected memory string MS0 performs programming on the memory cell MT4, in the region DR1, the channel semiconductor film 7 of the non-selected memory strings MS1, MS2, and MS3 is boosted as a result of the program pass voltage $V_{PASS1}$ and the program pass voltage $V_{PASS2}$ higher than the program pass voltage $V_{PASS1}$ being applied to memory cells of these non-selected memory strings during the period from the timings t4 to t5 (see FIG. 8) Thus, the channel semiconductor film 7 may be boosted to a higher voltage $V_{PASS2}$ (i.e., a voltage closer to the program voltage $V_{PGM}$) than when uniformly boosted to the program pass voltage $V_{PASS1}$. Therefore, the electric field stress applied to the memory cells MT4 of the non-selected memory strings MS1, MS2, and MS3 may be alleviated during the period from the timings t5 to t6 (see FIG. 8). As a result, the program disturb resistance may be improved as indicated by the dotted circles in FIG. 13.

In the fifth modification of the embodiment, when the word line WL4 becomes the selected word line, the non-selected word lines become a word line to which the program pass voltage $V_{PASS2}$ is applied or a word line to which the program pass voltage $V_{PASS1}$ is applied based on the string unit SU to which the page targeted for the program operation belongs. The example depicted in FIG. 13 corresponds to a case where string unit SU0 is selected.

In the regions DR2 and DR3, the program pass voltage $V_{PASS2}$ applied to the word lines WL0, WL2, WL6 of the memory cells MT0, MT2, and MT6 of the QLC is higher than the program pass voltage $V_{PASS1}$ applied to the word lines WL1, WL3, WL5, and WL7 of the memory cells MT1, MT3, MT5, and MT7 of the PLC. Thus, in the regions DR2 and DR3, the electric field stress of the memory cells MT1, MT3, MT5 and MT7 of the PLC may be made smaller than the electric field stress of the memory cells MT0, MT2, and MT6 of the QLC. That is, the program pass voltage for boosting the channel semiconductor film 7 to a higher voltage is only applied to word lines of the QLC (see FIGS. 4A and 4B) having a higher disturb resistance than the PLC. As a result, the VPASS disturb resistance of the memory cell array 430 as a whole may be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a plurality of conductive layers stacked above one another in a first direction and including a first conductive layer, second conductive layers, and third conductive layers;
a first semiconductor film extending in the first direction through the plurality of conductive layers; and
a first insulating film around the first semiconductor film between the first semiconductor film and the plurality of conductive layers, wherein
during a program operation performed on a first memory cell disposed at a first position where the first conductive layer intersects the first semiconductor film, a program voltage is applied to the first conductive layer while a first voltage is applied to the second conductive layers and a second voltage different from the first voltage is applied to the third conductive layers, and
the second conductive layers are each connected to gates of second memory cells, each of which has been programmed to store m bits of data, and the third conductive layers are each connected to gates of third memory cells, each of which has been programmed to store n bits of data, where n is different from m.

2. The semiconductor device according to claim 1, wherein n is greater than m and the first voltage is higher than the second voltage.

3. The semiconductor device according to claim 1, wherein the first conductive layer is adjacent to and between two of the second conductive layers, each of which is adjacent to a different one of the third conductive layers.

4. The semiconductor device according to claim 1, wherein the first conductive layer is adjacent to and between a first group of two adjacent second conductive layers and a second group of two adjacent second conductive layers.

5. The semiconductor device according to claim 4, wherein each of the first and second groups of two adjacent second conductive layers is adjacent to and between the first conductive layer and a different one of the third conductive layers.

6. The semiconductor device according to claim 1, the first conductive layer is adjacent to and between a first group of at least three adjacent second conductive layers and a second group of at least three adjacent second conductive layers.

7. The semiconductor device according to claim 1, wherein
a spacing between adjacent conductive layers in the plurality of conductive layers is not uniform and alternates between a first spacing and a second spacing.

8. The semiconductor device according to claim 7, wherein
n is greater than m and the first spacing is smaller than the second spacing, and
two of the adjacent conductive layers having the first spacing includes one of the second conductive layers which is below the first spacing.

9. The semiconductor device according to claim 7, wherein
n is greater than m and the first spacing is smaller than the second spacing, and
two of the adjacent conductive layers having the second spacing includes one of the second conductive layers which is below the first spacing.

10. A semiconductor device comprising:
a plurality of conductive layers stacked above one another in a first direction and including a first conductive layer, second conductive layers, and third conductive layers;
a first semiconductor film extending in the first direction through the plurality of conductive layers; and
a first insulating film around the first semiconductor film between the first semiconductor film and the plurality of conductive layers, wherein
during a program operation performed on a first memory cell disposed at a first position where the first conductive layer intersects the first semiconductor film, a program voltage is applied to the first conductive layer while a first voltage is applied to the second conductive layers and a second voltage different from the first voltage is applied to the third conductive layers, and
the second conductive layers are each connected to gates of second memory cells, each of which has been programmed to store m bits of data, and to gates of third memory cells, each of which has been programmed to store n bits of data, and the third conductive layers are each connected to gates of fourth memory cells, each of which has been programmed to store m bits of data, and to gates of fifth memory cells, each of which has been programmed to store n bits of data, where n is different from m.

11. The semiconductor device according to claim 10, further comprising:
a second semiconductor film extending in the first direction through the plurality of conductive layers; and
a second insulating film around the second semiconductor film between the second semiconductor film and the plurality of conductive layers, wherein
one of the second conductive layers is connected to a gate of one of the second memory cells disposed at a second position along the first semiconductor film and a gate of one of the third memory cells disposed at a third position along the second semiconductor film, and one of the third conductive layers is connected to a gate of one of the fourth memory cells disposed at a fourth position along the first semiconductor film and a gate of one of the fifth memory cells disposed at a fifth position along the second semiconductor film.

12. The semiconductor device according to claim 10, further comprising:
    a substrate above which the plurality of conductive layers are stacked, wherein
    the second and third memory cells are alternately disposed at positions along the first semiconductor film, and the fourth and fifth memory cells are alternately disposed at positions along the second semiconductor film, and
    each of the second memory cells has a corresponding fifth memory cell, which is at a same height above the substrate, and each of the third memory cells has a corresponding fourth memory cell, which is at a same height above the substrate.

13. The semiconductor device according to claim 10, wherein n is greater than m and the first voltage is higher than the second voltage.

14. A method of performing a programming operation in a semiconductor device that includes a plurality of conductive layers stacked above one another in a first direction and including a first conductive layer, second conductive layers, and third conductive layers, a first semiconductor film extending in the first direction through the plurality of conductive layers, and a first insulating film around the first semiconductor film between the first semiconductor film and the plurality of conductive layers, said method comprising:
    during a program operation performed on a first memory cell disposed at a first position where the first conductive layer intersects the first semiconductor film, applying a program voltage to the first conductive layer while applying a first voltage to the second conductive layers and a second voltage different from the first voltage to the third conductive layers, wherein
    the second conductive layers are each connected to gates of second memory cells, each of which has been programmed to store m bits of data, and the third conductive layers are each connected to gates of third memory cells, each of which has been programmed to store n bits of data, where n is different from m.

15. The method of claim 14, wherein n is greater than m and the first voltage is higher than the second voltage.

16. The method of claim 15, wherein
    a spacing between adjacent conductive layers in the plurality of conductive layers is not uniform and alternates between a first spacing and a second spacing.

17. The method of claim 16, wherein
    the first spacing is smaller than the second spacing, and two of the adjacent conductive layers having the first spacing includes one of the second conductive layers which is below the first spacing and are connected to the gates of the second memory cells which have already been programmed.

18. The method of claim 17, wherein
    two of the adjacent conductive layers having the first spacing includes one of the conductive layers which is above the first spacing and are connected to gates of memory cells which have not yet been programmed.

19. The method of claim 16, wherein
    the first spacing is smaller than the second spacing, and two of the adjacent conductive layers having the first spacing includes one of the second conductive layers which is above the first spacing and are connected to the gates of the second memory cells which have already been programmed.

20. The method of claim 19, wherein
    two of the adjacent conductive layers having the first spacing includes one of the conductive layers which is below the first spacing and are connected to gates of memory cells which have not yet been programmed.

* * * * *